(12) United States Patent
Hashimoto et al.

(10) Patent No.: US 9,741,555 B2
(45) Date of Patent: Aug. 22, 2017

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Tatsuru Matsuoka, Toyama (JP); Katsuyoshi Harada, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/994,334

(22) Filed: Jan. 13, 2016

(65) Prior Publication Data

US 2016/0203978 A1 Jul. 14, 2016

(30) Foreign Application Priority Data

Jan. 14, 2015 (JP) .................................. 2015-005042

(51) Int. Cl.
*H01L 21/02* (2006.01)
*C23C 16/50* (2006.01)
(Continued)

(52) U.S. Cl.
CPC ...... *H01L 21/02274* (2013.01); *C23C 16/345* (2013.01); *C23C 16/36* (2013.01);
(Continued)

(58) Field of Classification Search
CPC ...... C23C 16/325; C23C 16/345; C23C 16/36; C23C 16/452; C23C 16/50; H01L 21/02274; H01L 21/0217; H01L 21/0228
See application file for complete search history.

(56) References Cited

U.S. PATENT DOCUMENTS 7,592,234 B2    9/2009    Ohashi et al.
8,105,959 B2    1/2012    Ohashi
(Continued)

FOREIGN PATENT DOCUMENTS

JP    02-093071 A     4/1990
JP    2003-204060 A   7/2003
(Continued)

OTHER PUBLICATIONS

Japanese Office Action dated Nov. 1, 2016 for Application No. 2015-005042.
(Continued)

*Primary Examiner* — Michael Trinh
(74) *Attorney, Agent, or Firm* — Volpe and Koenig, P.C.

(57) ABSTRACT

A method of manufacturing a semiconductor device, includes: supplying a first precursor and a first nitriding agent onto a substrate having a surface formed thereon with an oxygen-containing film in order to form an initial film on the oxygen-containing film; modifying the initial film into a first nitride film by nitriding the initial film with plasma; and supplying a second precursor and a second nitriding agent onto the substrate in order to form a second nitride film on the first nitride film.

18 Claims, 17 Drawing Sheets

(51) Int. Cl.
*H01J 37/32* (2006.01)
*C23C 16/34* (2006.01)
*C23C 16/36* (2006.01)
*C23C 16/452* (2006.01)
*C23C 16/455* (2006.01)

(52) U.S. Cl.
CPC ...... *C23C 16/452* (2013.01); *C23C 16/45542* (2013.01); *C23C 16/50* (2013.01); *H01J 37/32009* (2013.01); *H01J 37/32357* (2013.01); *H01J 37/32449* (2013.01); *H01J 37/32513* (2013.01); *H01J 37/32522* (2013.01); *H01J 37/32541* (2013.01); *H01J 37/32568* (2013.01); *H01J 37/32623* (2013.01); *H01L 21/0217* (2013.01); *H01L 21/0228* (2013.01)

(56) References Cited

U.S. PATENT DOCUMENTS 8,318,554 B2 * 11/2012 Arai .................. H01L 29/4908
                                                                    438/149

2003/0232491 A1    12/2003  Yamaguchi
2005/0260357 A1 * 11/2005  Olsen .................. C23C 16/401
                                                                    427/569
2007/0090447 A1     4/2007  Morimoto
2008/0251835 A1    10/2008  Hashimoto
2011/0089496 A1     4/2011  Masuoka et al.
2014/0342573 A1    11/2014  Hirose et al.

FOREIGN PATENT DOCUMENTS

| JP | 2004-22902 A | 1/2004 |
| JP | 2007-194239 A | 8/2007 |
| JP | 2007-281181 A | 10/2007 |
| JP | 2008-041934 A | 2/2008 |
| JP | 2008-78376 A | 4/2008 |
| JP | 2010-206226 A | 9/2010 |
| TW | 201316441 | 4/2013 |
| TW | I429060 | 3/2014 |

OTHER PUBLICATIONS

Office Action and Search Report for corresponding TW Application.

* cited by examiner

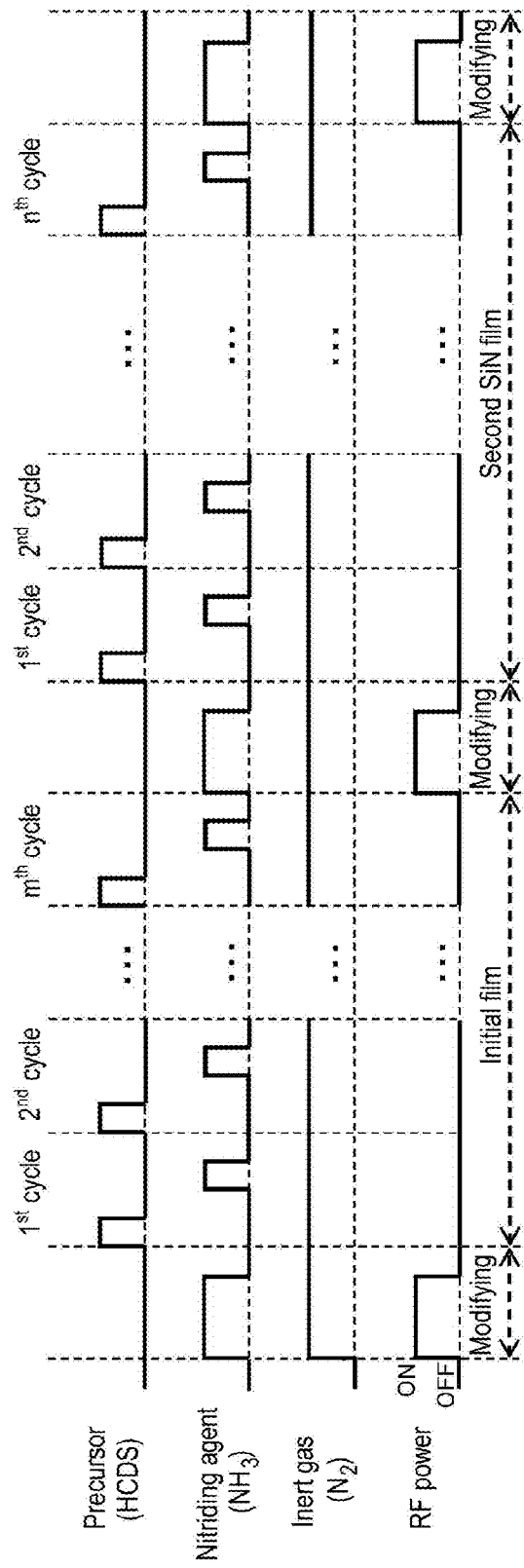

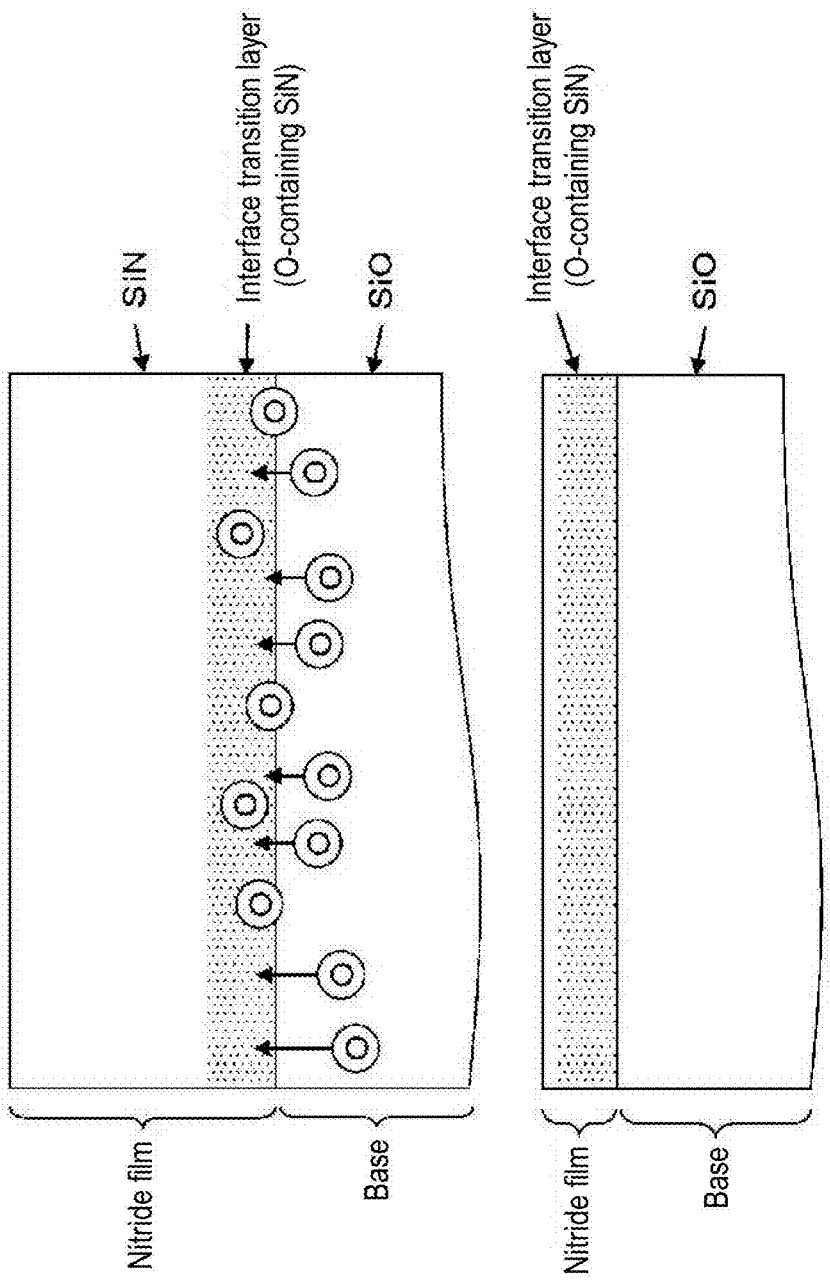

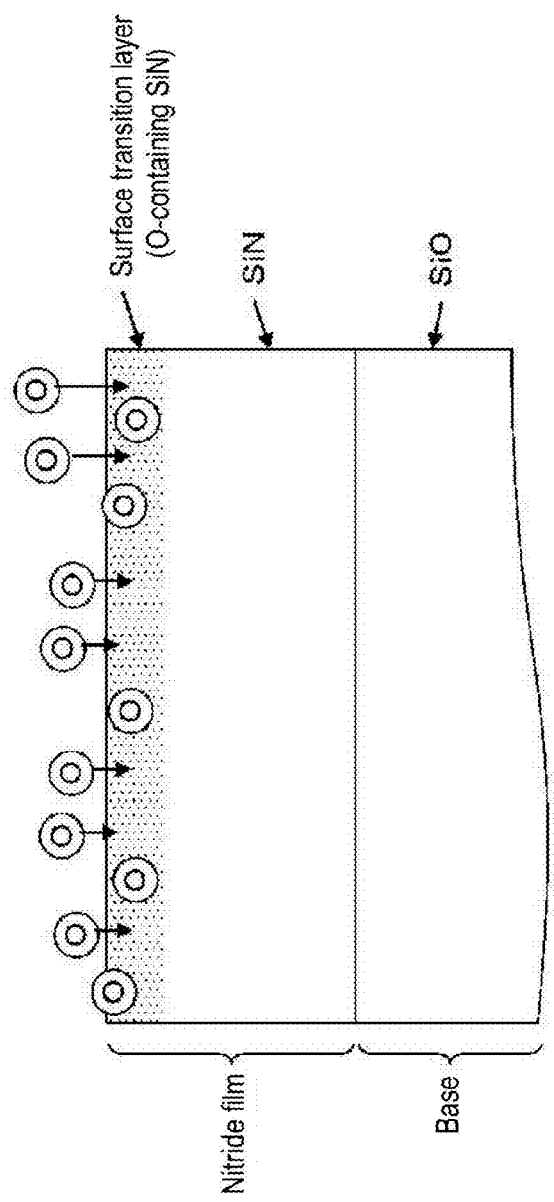
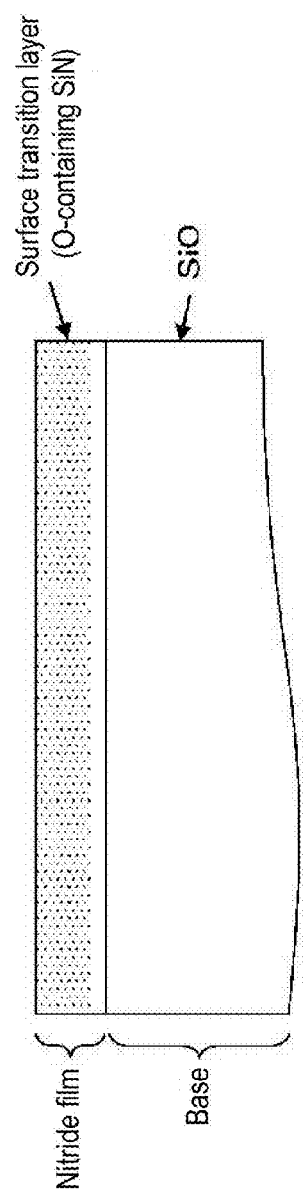
FIG. 9A
FIG. 9B

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2015-005042, filed on Jan. 14, 2015, the entire contents of which are incorporated herein by reference.

TECHNICAL FIELD

The present disclosure relates to a method of manufacturing a semiconductor device, a substrate processing apparatus and a recording medium.

BACKGROUND

As one of the processes for manufacturing a semiconductor device, there may be a process of forming a nitride film on a heated substrate by supplying a precursor and a nitriding agent onto the substrate.

SUMMARY

The present disclosure provides some embodiments of a technique capable of improving the composition controllability, film quality and so on of a nitride film formed on a substrate.

According to one embodiment of the present disclosure, there is provided a technique including: supplying a first precursor and a first nitriding agent onto a substrate having a surface formed thereon with an oxygen-containing film in order to form an initial film on the oxygen-containing film; modifying the initial film into a first nitride film by nitriding the initial film with plasma; and supplying a second precursor and a second nitriding agent onto the substrate in order to form a second nitride film on the first nitride film.

BRIEF DESCRIPTION OF THE DRAWINGS

FIG. 7 is a diagram illustrating gas supply and plasma power supply timings in Modification 3 of the film forming sequence according to one embodiment of the present disclosure.

FIG. 8A is a diagram illustrating a state where an interface transition layer is formed during formation of a nitride film and FIG. 8B is a diagram illustrating a state where most of the nitride film is occupied in the interface transition layer.

FIG. 9A is a diagram illustrating a state where an interface transition layer is formed after formation of a nitride film and FIG. 9B is a diagram illustrating a state where most of the nitride film is occupied in the interface transition layer.

DETAILED DESCRIPTION

In performing a film forming process of forming a nitride film on a heated substrate by supplying a precursor and a nitriding agent onto the substrate, if an oxygen (O)-containing film is already formed on the surface of the substrate, O contained in the O-containing film may be introduced (diffused) into a lower layer portion of the nitride film, i.e., near an interfacial portion with the O-containing film, during the film forming process. FIG. 8A is a diagram illustrating a state where O is introduced into a lower layer of a silicon nitride film (SiN film) formed on a substrate having a surface formed thereon with a silicon oxide film (SiO film). For convenience' sake, FIG. 8A shows an extracted portion over the SiO film formed on the substrate. This is equally applied to FIGS. 8B, 9A, 9B, 10A to 10C, 11A to 11D, 12A to 12D and 13A to 13E. A nitride layer containing O (oxynitride layer) is a layer having a different composition from a film (O-non-containing nitride film) to be formed on the substrate, which may be a factor of lowering the resistance of the film formed on the substrate against hydrogen fluoride (HF). Therefore, a nitride layer containing O may be also referred to as a deterioration layer (interface deterioration layer) or a transition layer (interface transition layer). In some cases, the interface transition layer may be formed under a high temperature such as a film formation temperature of a nitride film, although it is hardly formed under the normal temperature after completion of the film forming process.

A range of O introduction, in other words, the thickness of the interface transition layer, is about 30 Å. Therefore, if the thickness of a nitride film formed on an O-containing film is set to about 30 Å, most of a film formed on the substrate may be occupied in the interface transition layer or the entire film may become a nitride film containing O. FIG. 8B is a diagram showing a state where most of the nitride film is occupied in the surface transition layer. In this way, a nitride film having a high percentage of occupation in the interface transition layer may be significantly decreased in resistance to HF as compared to an O-non-containing nitride film.

The above problem is a new issue that was first revealed by intensive studies of the present inventors in the progress of recent miniaturization. As a result of intensive studies for overcoming the above problem, the present inventors have found that the above problem could be overcome by forming an initial film on an O-containing film, modifying the initial film by nitriding the initial film with plasma, and forming a nitride film on the modified initial film. The present disclosure is based on such findings.

One Embodiment of the Present Disclosure

One embodiment of the present disclosure based on the findings will now be described in detail with reference to the drawings.

(1) Configuration of Substrate Processing Apparatus

Figure 1:
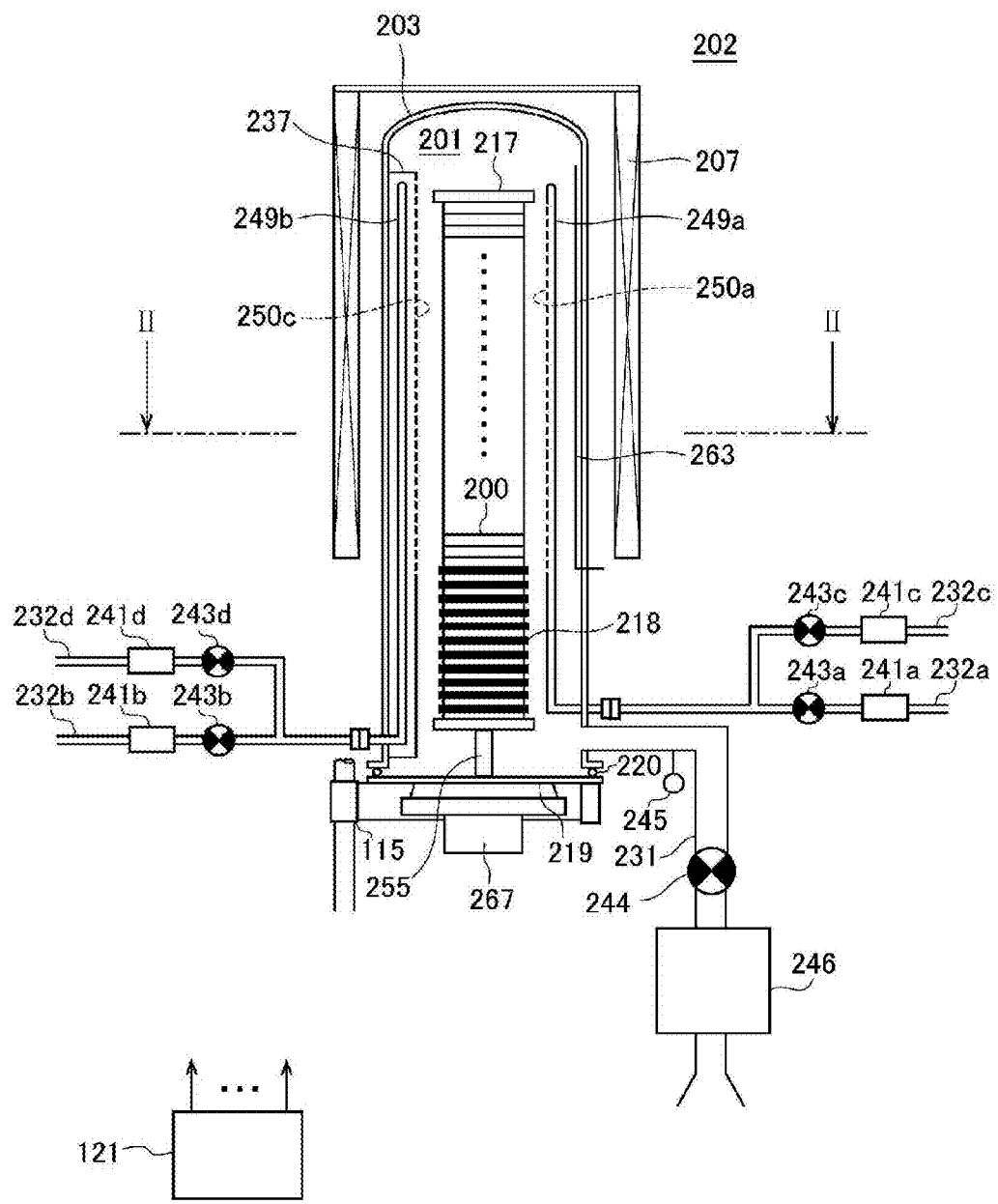
FIG. 1 is a schematic view illustrating a configuration of a vertical processing furnace of a substrate processing apparatus suitably used in one embodiment of the present disclosure, the processing furnace being shown in a longitudinal sectional view.

As shown in FIG. 1, a processing furnace 202 includes a heater 207 as a heating part (heating mechanism). The heater 207 has a cylindrical shape and is vertically installed by being supported by a heater base (not shown) as a support plate. The heater 207 also serves as an activating mechanism (exciting part) to activate (excite) a gas with heat, which will be described later.

A reaction tube 203 forming a reaction vessel (process vessel) is disposed inside the heater 207 in a concentric form with the heater 207. The reaction tube 203 is made of a heat resistant material such as quartz ($SiO_2$) or silicon carbide (SiC), and has a cylindrical shape with its upper end closed and its lower end opened. A process chamber 201 is defined in a hollow cylindrical portion of the reaction tube 203. The process chamber 201 is configured to accommodate a plurality of wafers 200 as substrates in a state where horizontally-positioned wafers 200 are vertically stacked in multiple stages in a boat 217 described later.

Nozzles 249a and 249b are installed in the process chamber 201 to extend through the lower side wall of the reaction tube 203. The nozzles 249a and 249b are made of a heat resistant material such as quartz or SiC. The nozzles 249a and 249b are connected with gas supply pipes 232a and 232b, respectively. In this way, the two nozzles 249a and 249b and the two gas supply pipes 232a and 232b are installed at the reaction tube 203, and thus, a plurality of kinds of gases can be supplied into the process chamber 201.

However, the processing furnace 202 of this embodiment is not limited to the above-mentioned shape. For example, a metal manifold supporting the reaction tube 203 may be installed below the reaction tube 203 and the nozzles may be installed to extend through the side wall of the manifold. In this case, an exhaust pipe 231 described later may be further installed in the manifold. Even in this case, the exhaust pipe 231 may be installed below the reaction tube 203 instead of the manifold. In this way, a furnace opening portion of the processing furnace 202 may be made of metal and the nozzles and so on may be installed in the metal furnace opening portion.

MFCs (Mass Flow Controllers) 241a and 241b, which are flow rate controllers (flow rate control parts), and valves 243a and 243b, which are opening/closing valves, are respectively installed in the gas supply pipes 232a and 232b in this order from an upstream side. Gas supply pipes 232c and 232d for supplying an inert gas are respectively connected to the gas supply pipes 232a and 232b at a downstream side of the valves 243a and 243b. MFCs 241c and 241d, which are flow rate controllers (flow rate control parts), and valves 243c and 243d, which are opening/closing valves, are respectively installed in the gas supply pipes 232c and 232d in this order from an upstream side.

Figure 2:
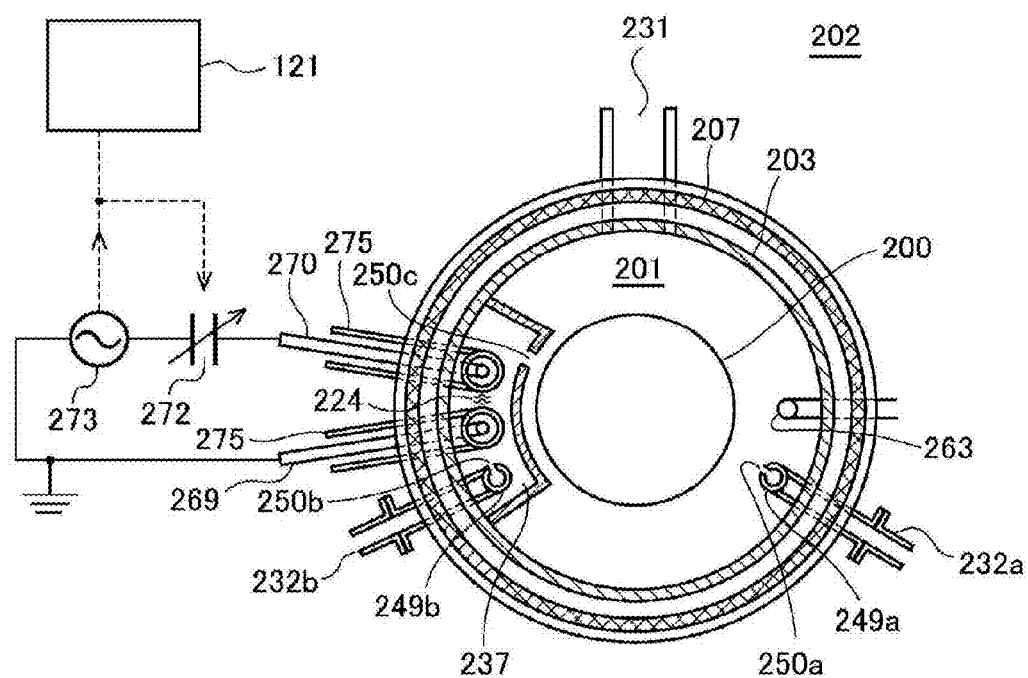
FIG. 2 is a schematic view illustrating a configuration of the vertical processing furnace of the substrate processing apparatus suitably used in the embodiment of the present disclosure, the processing furnace being shown in a sectional view taken along a line II-II in FIG. 1.

The nozzle 249a is connected to a leading end portion of the gas supply pipe 232a. As shown in FIG. 2, the nozzle 249a is installed in an annular space between the inner wall of the reaction tube 203 and the wafers 200. The nozzle 249a is vertically disposed along the inner wall of the reaction tube 203 to extend upward in the stacking direction of the wafers 200. That is, the nozzle 249a is installed in a region horizontally surrounding a wafer arrangement region in which the wafers 200 are arranged, while being arranged along the wafer arrangement region. That is, the nozzle 249a is installed in the side of the end portion (peripheral portion) of each of the wafers 200 loaded into the process chamber 201 in such a manner that the nozzle 249a is perpendicular to the surface (flat side) of each of the wafers 200. The nozzle 249a is formed of an L-shaped long nozzle. A horizontal portion of the nozzle 249a is installed to extend through the lower sidewall of the reaction tube 203, while a vertical portion of the nozzle 249a being installed to extend upward from at least one end portion of the wafer arrangement region toward the other end portion thereof. A plurality of gas supply holes 250a through which a gas is supplied is formed in the side surface of the nozzle 249a. The gas supply holes 250a are opened toward the center of the reaction tube 203 so that a gas can be supplied toward the wafers 200. The plurality of gas supply holes 250a having the same opening area are disposed over a space from a lower portion to an upper portion of the reaction tube 203 with the same opening pitch therebetween.

The nozzle 249b is connected to a leading end portion of the gas supply pipe 232b. The nozzle 249b is installed in a buffer chamber 237. The buffer chamber 237 also serves as a gas dispersion space. The buffer chamber 237 is installed in an annular space between the inner wall of the reaction tube 203 and the wafers 200. The buffer chamber 237 is vertically disposed along the inner wall of the reaction tube 203 to extend in the stacking direction of the wafers 200. That is, the buffer chamber 237 is installed in a region horizontally surrounding the wafer arrangement region in which the wafers 200 are arranged, while being arranged along the wafer arrangement region. That is, the buffer chamber 237 is installed in the side of the end portion of each of the wafers 200 loaded into the process chamber 201. A plurality of gas supply holes 250c through which a gas is supplied is formed in an end portion of a wall of the buffer chamber 237, which is adjacent to the wafers 200. The gas supply holes 250c are opened toward the center of the reaction tube 203 so that a gas can be supplied toward the wafers 200. The plurality of gas supply holes 250c having the same opening area are disposed over a space from the lower portion to the upper portion of the reaction tube 203 with the same opening pitch therebetween.

The nozzle 249b is vertically disposed at an end portion in the opposite side to the end portion of the buffer chamber 237 in which the gas supply holes 250c are formed, along the inner wall of the reaction tube 203 to extend upward in the stacking direction of the wafers 200. That is, the nozzle 249b is installed in a region horizontally surrounding the wafer arrangement region in which the wafers 200 are arranged, while being arranged along the wafer arrangement region. That is, the nozzle 249b is installed in the side of the end portion of each of the wafers 200 loaded into the process chamber 201 in such a manner that the nozzle 249b is perpendicular to the surface of each of the wafers 200. The nozzle 249b is formed of an L-shaped long nozzle. A horizontal portion of the nozzle 249b is installed to extend through the lower sidewall of the reaction tube 203, while a vertical portion of the nozzle 249b being installed to extend upward from at least one end portion of the wafer arrangement region toward the other end portion thereof. A plurality of gas supply holes 250b through which a gas is supplied is formed in the side surface of the nozzle 249b. The gas supply holes 250b are opened toward the center of the reaction tube 203. Like the gas supply holes 250c, the plurality of gas supply holes 250b are disposed over a space from the lower portion to the upper portion of the reaction tube 203. If a difference in pressure between the buffer chamber 237 and the process chamber 201 is small, the plurality of gas supply holes 250b may have the same opening area and opening pitch over a space from the upstream side (lower portion) to the downstream side (upper portion). If the difference in pressure between the buffer chamber 237 and the process chamber 201 is large, the opening area of the gas supply holes 250b may be gradually increased from the upstream side to the downstream side or the opening pitch of the gas supply holes 250b may be gradually decreased from the upstream side to the downstream side.

By adjusting the opening area and the opening pitch of each of the gas supply holes 250b over the space from the upstream side to the downstream side as described above, it is possible to eject gases having substantially the same flow rate from the gas supply holes 250b although the gases have different flow velocities. In addition, once the gases ejected from the plurality of gas supply holes 250b are introduced in the buffer chamber 237, it is possible to uniformalize a difference in flow velocity between the gases in the buffer chamber 237. The gases ejected from the plurality of gas supply holes 250b into the buffer chamber 237 are decreased in terms of particle velocity and are then ejected from the plurality of gas supply holes 250c into the process chamber 201. The gases ejected from the plurality of gas supply holes 250b into the buffer chamber 237 have the uniform flow rate and flow velocity when the gases are ejected from the plurality of gas supply holes 250c into the process chamber 201.

As described above, in this embodiment, the gas is transferred via the nozzles 249a and 249b and the buffer chamber 237, which are disposed inside an annular vertically extending space, i.e., a cylindrical space, defined by the inner side wall of the reaction tube 203 and the end portions of the stacked wafers 200 in the reaction tube 203. Then, the gas is first ejected into the reaction tube 203 near the wafers 200 through the gas supply holes 250a to 250c formed in the nozzles 249a and 249b and the buffer chamber 237, respectively. Thus, a main flow of the gas in the reaction tube 203 follows a direction parallel to surfaces of the wafers 200, i.e., the horizontal direction. With this configuration, the gas can be uniformly supplied to the respective wafers 200, thereby making it possible to improve the uniformity of the thickness of a film formed on the surface of each of the wafers 200. A gas flowing over the surfaces of the wafers 200, i.e., a residual gas after the reaction, flows toward an exhaust port, i.e., the exhaust pipe 231 described later. However, a flow direction of the residual gas is not limited to the vertical direction but may be suitably adjusted depending on a position of the exhaust port.

A precursor gas (first and second precursors) containing a certain element, for example, a halosilane precursor gas containing a silicon (Si) element as the certain element and a halogen element, is supplied from the gas supply pipe 232a into the process chamber 201 through the MFC 241a, the valve 243a and the nozzle 249a.

The halosilane precursor gas may include a halosilane precursor in a gaseous state, for example, a gas obtained by vaporizing a halosilane precursor that is in a liquid state under normal temperature and pressure, a halosilane precursor that is in a gaseous state under normal temperature and pressure, or the like. The halosilane precursor may include a silane precursor having a halogen group. The halogen group includes a chloro group, a fluoro group, a bromo group and an iodo group. That is, the halogen group includes halogen elements such as chlorine (Cl), fluorine (F), bromine (Br) and iodine (I). The halosilane precursor may refer to a kind of halide. When the term "precursor" is used herein, it may refer to "a liquid precursor in a liquid state," "a precursor gas in a gaseous state," or both of them.

As the halosilane precursor gas, for example, a precursor gas containing Si and Cl, i.e., a chlorosilane precursor gas, may be used. As the chlorosilane precursor gas, a hexachlorodisilane ($Si_2Cl_6$, abbreviation: HCDS) gas may be used. When such a liquid precursor as an HCDS that is in a liquid state at the normal temperature and pressure is used, it may be supplied as a precursor gas (HCDS gas) after being vaporized by a vaporizing system such as a vaporizer or a bubbler.

As one example of a reaction gas having a chemical structure (molecular structure) different from that of the precursor gas, a nitrogen (N)-containing gas is supplied from the gas supply pipe 232b into the process chamber 201 via the MFC 241b, the valve 243b, the nozzle 249b and the buffer chamber 237. An example of the N-containing gas may include a hydrogen nitride-based gas. The hydrogen nitride-based gas may also refer to a material consisting of only two elements of N and H and acts as a nitriding agent (first and second nitriding agents), i.e., a nitriding gas (N source), in a substrate processing process, which will be described later. As an example of the hydrogen nitride-based gas, an ammonia ($NH_3$) gas may be used.

As one example of a reaction gas having a chemical structure different from that of the precursor gas, a carbon (C)-containing gas is supplied from the gas supply pipe 232b into the process chamber 201 via the WC 241b, the valve 243b, the nozzle 249b and the buffer chamber 237. An example of the C-containing gas may include a hydrogen carbide-based gas. The hydrogen carbide-based gas may also refer to a material consisting of only two elements of C and H and acts as a C source in a substrate processing process, which will be described later. As an example of the hydrogen carbide-based gas, a propylene ($C_3H_6$) gas may be used.

As one example of a reaction gas having a chemical structure different from that of the precursor gas, an oxygen (C)-containing gas is supplied from the gas supply pipe 232b into the process chamber 201 via the WC 241b, the valve 243b, the nozzle 249b and the buffer chamber 237. The O-containing gas acts as an oxidizing agent, i.e., an oxidizing gas (O source), in a substrate processing process, which will be described later. As an example of the O-containing gas, an oxygen ($O_2$) gas may be used.

As one example of a reaction gas having a chemical structure different from that of the precursor gas, a boron (B)-containing gas is supplied from the gas supply pipe 232b into the process chamber 201 via the WC 241b, the valve 243b, the nozzle 249b and the buffer chamber 237. As an example of the B-containing gas, a borane-based gas may be used.

The borane-based gas may include a borane compound in a gaseous state, for example, a gas obtained by vaporizing a borane compound that is in a liquid state under the normal temperature and pressure, a borane compound that is in a gaseous state under the normal temperature and pressure, or the like. The borane compound may include a haloborane compound containing B and a halogen element, for example, a chloroborane compound containing B and Cl. In addition, the borane compound may include borane (borohydride) such as monoborane ($BH_3$) or diborane ($B_2H_6$), or a borane compound (borane derivative) in the form obtained by substituting H in borane with a different element. The borane-based gas acts as a B source in the substrate processing process, which will be described later. As an example of the borane-based gas, a trichloroborane ($BCl_3$) gas may be used.

An inert gas such as a nitrogen ($N_2$) gas is supplied from the gas supply pipes 232c and 232d into the process chamber 201 via the MFCs 241c and 241d, the valves 243c and 243d, the gas supply pipes 232a and 232b, the nozzle 249a and 249b and the buffer chamber 237, respectively.

When the precursor gas is supplied from the gas supply pipe 232a, a precursor gas supply system is mainly constituted by the gas supply pipe 232a, the MFC 241a and the valve 243a. The nozzle 249a may be included in the precursor gas supply system. The precursor gas supply system may be also called a precursor supply system. When the halosilane precursor gas is supplied from the gas supply pipe 232a, the precursor gas supply system may be also called a halosilane precursor gas supply system or a halosilane precursor supply system.

When the N-containing gas is supplied from the gas supply pipe 232b, an N-containing gas supply system is mainly constituted by the gas supply pipe 232b, the MFC 241b and the valve 243b. The nozzle 249b and the buffer chamber 237 may be included in the N-containing gas supply system. The N-containing gas supply system may be also called a nitriding agent supply system or a nitriding gas supply system. When the hydrogen nitride-based gas is supplied from the gas supply pipe 232b, the N-containing gas supply system may be also called a hydrogen nitride-based gas supply system or a hydrogen nitride supply system.

When the C-containing gas is supplied from the gas supply pipe 232b, a C-containing gas supply system is mainly constituted by the gas supply pipe 232b, the MFC 241b and the valve 243b. The nozzle 249b and the buffer chamber 237 may be included in the C-containing gas supply system. When the hydrogen nitride-based gas is supplied from the gas supply pipe 232b, the C-containing gas supply system may be also called a hydrogen carbide-based gas supply system or a hydrogen carbide supply system.

When the O-containing gas is supplied from the gas supply pipe 232b, an O-containing gas supply system is mainly constituted by the gas supply pipe 232b, the MFC 241b and the valve 243b. The nozzle 249b and the buffer chamber 237 may be included in the O-containing gas supply system. The O-containing gas supply system may be also called an oxidizing agent supply system or an oxidizing gas supply system.

When the B-containing gas is supplied from the gas supply pipe 232b, a B-containing gas supply system is mainly constituted by the gas supply pipe 232b, the MFC 241b and the valve 243b. The nozzle 249b and the buffer chamber 237 may be included in the B-containing gas supply system. When the borane-based gas is supplied from the gas supply pipe 232b, the B-containing gas supply system may be also called a borane-based gas supply system, a borane compound supply system or a borane compound gas supply system.

One or all of the above-mentioned N-containing gas supply system, C-containing gas supply system, O-containing gas supply system and B-containing gas supply system may be also called a reaction gas supply system or a reaction gas supply system. In addition, the precursor gas supply system and the reaction gas supply system may be collectively called a film formation gas supply system.

An inert gas supply system is mainly constituted by the gas supply pipes 232c and 232d, the MFCs 241c and 241d and the valves 243c and 243d. The inert gas supply system may be also called a purge gas supply system, a dilution gas supply system or a carrier gas supply system.

As shown in FIG. 2, two bar-shaped electrodes 269 and 270 made of a conductive material and having an elongated structure are disposed in the buffer chamber 237 along the stacking direction of the wafers 200 over a space from the lower portion to the upper portion of the reaction tube 203. Each of the bar-shaped electrodes 269 and 270 is disposed in parallel to the nozzle 249b. Each of the bar-shaped electrodes 269 and 270 is protected by being covered by an electrode protective tube 275 over a space from the upper portion to the lower portion. One of the bar-shaped electrodes 269 and 270 is connected to a high frequency power supply 273 via a matching device 272 and the other is connected to a ground as a reference potential. When high frequency (RF) power is applied between the bar-shaped electrodes 269 and 270 from the high frequency power supply 273 via the matching device 272, plasma is generated in a plasma generation region 224 between the bar-shaped electrodes 269 and 270. A plasma source as a plasma generator (plasma generating part) is mainly constituted by the bar-shaped electrodes 269 and 270 and the electrode protective tube 275. The matching device 272 and the high frequency power supply 273 may be included in the plasma source. The plasma source acts as a plasma exciting part (activation mechanism) for exciting a gas with plasma, i.e., exciting (activating) the gas into a plasma state, which will be described later.

The electrode protective tube 275 has a structure capable of being inserted in the buffer chamber 237 in a state where each of the bar-shaped electrodes 269 and 270 is separated from the internal atmosphere of the buffer chamber 237. If the internal O concentration in the electrode protective tube 275 is about equal to the O concentration in the external air (atmosphere), each of the bar-shaped electrodes 269 and 270 inserted in the electrode protective tube 275 may be oxidized by heat from the heater 207. By filling the electrode protective tube 275 with an inert gas such as an $N_2$ gas or by using an inert gas purge mechanism to purge the interior of the electrode protective tube with an inert gas such as an $N_2$ gas, it is possible to reduce the internal O concentration in the electrode protective tube 275, thereby preventing the bar-shaped electrodes 269 and 270 from being oxidized.

The exhaust pipe 231 for exhausting the internal atmosphere of the process chamber 201 is installed at the reaction tube 203. A pressure sensor 245, which is a pressure detector (pressure detecting part) for detecting the internal pressure of the process chamber 201, an APC (Auto Pressure Controller) valve 244, which is a pressure regulator (pressure adjusting part), and a vacuum pump 246 as a vacuum exhaust device are connected to the exhaust pipe 231. The APC valve 244 is configured to start/stop vacuum exhaust in the process chamber 201 by opening/closing a valve in a state where the vacuum pump 246 is in operation, and further to adjust the internal pressure of the process chamber 201 by adjusting a degree of valve opening based on pressure information detected by the pressure sensor 245 in a state where the vacuum pump 246 is in operation. An exhaust system is mainly constituted by the exhaust pipe 231, the APC valve 244 and the pressure sensor 245. The vacuum pump 246 may also be included in the exhaust system.

A seal cap 219 as a lid for a furnace opening configured to hermetically seal a lower end opening of the reaction tube 203 is installed under the reaction tube 203. The seal cap 219 is configured to contact the lower end portion of the reaction tube 203 from the lower side of the reaction tube 203 in the vertical direction. The seal cap 219 is made of, for example, metal such as stainless steel (SUS) and has a disc shape. An O-ring 220, which is a seal member in contact with the lower end portion of the reaction tube 203, is installed at an upper surface of the seal cap 219. A rotary mechanism 267 configured to rotate the boat 217 described later is installed at a side of the seal cap 219 opposite to the process chamber 201. A rotary shaft 255 of the rotary mechanism 267 extends through the seal cap 219 and is connected to the boat 217. The rotary mechanism 267 is configured to rotate the wafers 200 by rotating the boat 217. The seal cap 219 is configured to be vertically moved by a boat elevator 115, which is an elevation mechanism vertically disposed at the outside of the reaction tube 203. The boat elevator 115 is configured to load/unload the boat 217 in/from the process chamber 201 by raising/lowering the seal cap 219. That is, the boat elevator 115 is configured as a transfer device (transfer mechanism) that transfers the boat 217 and the wafers 200 supported by the boat 217 into and out of the process chamber 201.

The boat 217, which is used as a substrate support, is configured to support a plurality of wafers 200, e.g., 25 to 200 sheets, in a state where horizontally-positioned wafers 200 are vertically stacked in multiple stages, i.e., being separated from each other, with the centers of the wafers 200 aligned with each other. The boat 217 is made of, for example, heat resistant material such as quartz or silicon carbide (SiC). Heat insulating plates 218 made of, for example, heat resistant material such as quartz or silicon carbide (SiC) are stacked in multiple stages, being in a horizontal position, at a lower portion of the boat 217. With this configuration, heat from the heater 207 is difficult to be transferred to the seal cap 219. However, this embodiment is not limited thereto. Instead of installing the heat insulating plates 218 at the lower portion of the boat 217, a heat insulating tube formed of a tubular member made of heat resistant material such as quartz or SiC may be installed.

A temperature sensor 263, which is a temperature detector, is installed in the reaction tube 203. A condition of current applying to the heater 207 is adjusted based on temperature information detected by the temperature sensor 263, so that the interior of the process chamber 201 has a desired temperature distribution. The temperature sensor 263 has an L-shaped configuration, like the nozzles 249a and 249b, and is installed along the inner wall of the reaction tube 203.

Figure 3:
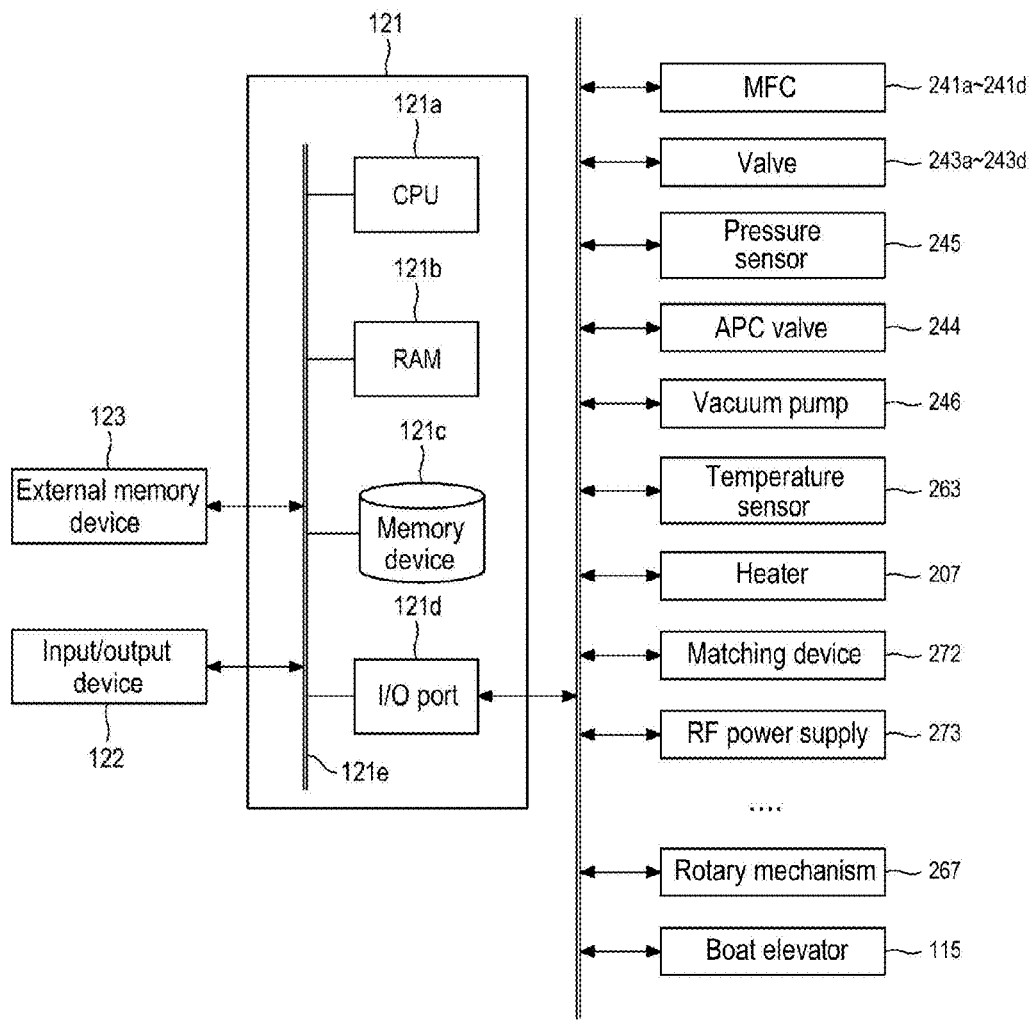
FIG. 3 is a schematic view illustrating a configuration of a controller of the substrate processing apparatus suitably used in the embodiment of the present disclosure, a control system of the controller being shown in a block diagram.

As illustrated in FIG. 3, a controller 121 serving as a control part is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like, is connected to the controller 121.

The memory device 121c is configured with, for example, a flash memory, an HDD (Hard Disk Drive), or the like. A control program for controlling operations of the substrate processing apparatus and a process recipe in which a sequence or condition for substrate processing to be described later is written are readably stored in the memory device 121c. The process recipe, which is a combination of sequences, causes the controller 121 to execute each sequence in a substrate processing process to be described later in order to obtain a predetermined result, and functions as a program. Hereinafter, the process recipe and the control program may be collectively referred to as a program. When the term "program" is used herein, it may include a case in which only one of the process recipe and the control program is included, or a case in which any combination of the process recipe and the control program is included. The RAM 121b is configured as a memory area (work area) in which a program or data read by the CPU 121a is temporarily stored.

The I/O port 121d is connected to the above-described MFCs 241a to 241e, valves 243a to 243d, pressure sensor 245, APC valve 244, vacuum pump 246, heater 207, temperature sensor 263, high frequency power supply 273, matching device 272, rotary mechanism 267, boat elevator 115 and so on.

The CPU 121a is configured to read and execute the control program from the memory device 121c. According to an input of an operation command from the input/output device 122, the CPU 121a reads the process recipe from the memory device 121c. The CPU 121a is configured to control the flow rate controlling operation of various types of gases by the MFCs 241a to 241d, the opening/closing operation of the valves 243a to 243d, the opening/closing operation of the APC valve 244, the pressure adjusting operation by the APC valve 244 based on the pressure sensor 245, the operation of starting and stopping the vacuum pump 246, the temperature adjusting operation of the heater 207 based on the temperature sensor 263, the supply of power by the high frequency power supply 273, the impedance adjusting operation by the matching device 272, the rotation and rotation speed adjusting operation of the boat 217 by the rotary mechanism 267, the elevation operation of the boat 217 by the boat elevator 115, and the like according to contents of the read process recipe.

The controller 121 is not limited to being configured as a dedicated computer but may be configured as a general-purpose computer. For example, the controller 121 of this embodiment may be configured by preparing an external memory device 123 (for example, a magnetic tape, a magnetic disc such as a flexible disc or a hard disk, an optical disc such as a CD or DVD, a magneto-optical disc such as an MO, a semiconductor memory such as a USB memory or a memory card, etc.), in which the program is stored, and installing the program on the general-purpose computer using the external memory device 123. However, a means for supplying a program to a computer is not limited to the case in which the program is supplied through the external memory device 123. For example, the program may be supplied using a communication means such as Internet or a dedicated line, rather than through the external memory device 123. The memory device 121c or the external memory device 123 is configured as a non-transitory computer-readable recording medium. Hereinafter, these means for supplying the program will be simply referred to as "a recording medium." When the term "recording medium" is used herein, it may include a case in which only the memory device 121c is included, a case in which only the external memory device 123 is included, or a case in which both the memory device 121c and the external memory device 123 are included.

(2) Substrate Processing

Next, an example of a sequence of forming a film on a substrate, which is one of the processes for manufacturing a semiconductor device using the above-described substrate processing apparatus, will be described with reference to FIG. 4 and FIGS. 10A to 10C. In the following description, operations of various parts constituting the substrate processing apparatus are controlled by the controller 121.

The film forming sequence shown in FIG. 4 includes step 1 of supplying an HCDS gas serving as a first precursor and an $NH_3$ gas serving as a first nitriding agent onto a wafer 200, which is a substrate having a surface formed thereon with a silicon oxide film 200a ($SiO_2$ film; hereinafter simply referred to as an "SiO film.") serving as an O-containing film, in order to form an initial film 210a on the SiO film 200a, step 2 of modifying the initial film 210a into a silicon nitride film (first SiN film) 210b serving as a first nitride film by nitriding the initial film 210a with plasma, and step 3 of supplying an HCDS gas serving as a second precursor and an $NH_3$ gas serving as a second nitriding agent onto the wafer 200 in order to form a silicon nitride film 210c (second SiN film) serving as a second nitride film on the first SiN film 210b.

It is illustrated in this embodiment that the first precursor has the same molecular structure as the second precursor and the first nitriding agent has the same molecular structure as the second nitriding agent.

In the present disclosure, for convenience' sake, the film forming sequence may be sometimes expressed as follows. This is equally applied to the following embodiments, modifications and other embodiments.

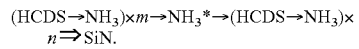

$$(HCDS \rightarrow NH_3) \times m \rightarrow NH_3^* \rightarrow (HCDS \rightarrow NH_3) \times n \Rightarrow SiN.$$

In the present disclosure, the term "wafer" may be used for referring to not only a wafer per se but also a laminated body (aggregate) of a wafer and certain layers or films formed on a surface of the wafer (that is, a wafer including certain layers or films formed on a surface of the wafer is sometimes referred to as a "wafer"). In the present disclosure, the term "surface of a wafer" may mean a surface (exposed surface) of a wafer per se, or a surface of a specified layer or film formed on the wafer, namely, an outermost surface of the wafer as a laminated body.

In the present disclosure, the expression "supplying a specified gas onto a wafer" may mean that the specified gas is directly supplied onto a surface (exposed surface) of a wafer per se, or that the specified gas is supplied onto a surface of a certain layer or film formed on the wafer, namely, onto an outermost surface of the wafer as a laminated body. In the present disclosure, the expression "forming a certain layer (or film) on a wafer" may mean that the certain layer (or film) is directly formed on the surface (exposed surface) of the wafer per se, or that the certain layer (or film) is formed on the surface of a certain layer or film formed on the wafer, namely, on an outermost surface of the wafer as a laminated body.

In the present disclosure, the term "substrate" is interchangeably used with the term "wafer." Thus, with regard to the aforementioned description, the term "wafer" may be replaced with the term "substrate."

(Wafer Charging and Boat Loading)

A plurality of wafers 200 are charged on the boat 217 (wafer charging). Thereafter, as illustrated in FIG. 1, the boat 217 holding the plurality of wafers 200 is lifted up by the boat elevator 115 to be loaded into the process chamber 201 (boat loading). In this state, the seal cap 219 seals the lower end portion of the reaction tube 203 via the O-ring 220.

Figure 10A:
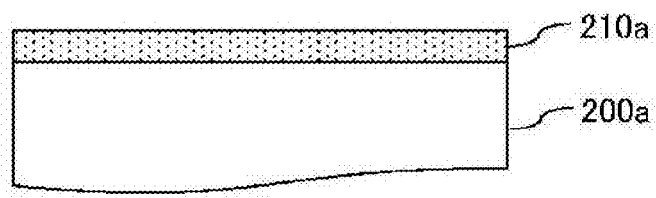
FIG. 10A is a diagram showing a state where an initial film is formed on an oxygen-containing film.

As described above, the SiO film 200a, which is an O-containing film, is beforehand formed on at least a portion of the surface of each of the wafers 200 (see FIG. 10A). This SiO film 200a becomes at least a portion of a base film when the initial film 210a is formed in step 1 to be described later. The SiO film 200a may be formed to cover all or some of the surface of the wafer 200. As the O-containing film, in addition to the SiO film 200a, an Si-based O-containing film such as a silicon oxynitride film (SiON film), a silicon oxycarbide film (SiOC film), a silicon oxycarbonitride film (SiOCN film) or the like, or a metal-based O-containing film, i.e., a high dielectric constant (high-k) film,), such as an aluminum oxide film (AlO film), a hafnium oxide film (HfO film), a zirconium oxide film (ZrO film), a titanium oxide film (TiO film) or the like, may be formed. The O-containing film (the oxide film, the oxynitride film, the oxycarbide film and the oxycarbonitride film) as used herein includes a natural oxide film formed naturally when exposed to the air while being transferred, in addition to a film intentionally formed when subjected to a predetermined process such as CVD, plasma CVD, thermal oxidation, thermal oxynitridation, plasma oxidation, plasma oxynitridation or the like.

(Pressure Adjustment and Temperature Adjustment)

The interior of the process chamber 201 (i.e., the space in which the wafers 200 exist) is evacuated (or depressurized) by the vacuum pump 246 to reach a desired pressure (vacuum level). Here, the internal pressure of the process chamber 201 is measured by the pressure sensor 245, and the APC valve 244 is feedback-controlled based on the measured pressure information. The vacuum pump 246 is always kept in an operative state at least until a process on the wafers 200 is terminated. Further, the wafers 200 within the process chamber 201 are heated by the heater 207 to a desired temperature. Here, current applying conditions to the heater 207 is feedback-controlled based on the temperature information detected by the temperature sensor 263 in order to keep a desired temperature distribution in the interior of the process chamber 201. Such heating the interior of the process chamber 201 by the heater 207 is continuously performed at least until a process on the wafers 200 is terminated. Further, the boat 217 and wafers 200 begin to be rotated by the rotary mechanism 267. The rotation of the boat 217 and wafers 200 by the rotary mechanism 267 is continuously performed at least until a process on the wafers 200 is terminated.

(Step 1: Initial Film Formation)

Thereafter, the following two sub-steps, i.e., sub-step 1a and sub-step 1b, are sequentially performed.

[Sub-Step 1a]

In this sub-step, an HCDS gas is supplied onto the wafers 200 within the process chamber 201.

The valve 243a is opened to flow the HCDS gas into the gas supply pipe 232a. A flow rate of the HCDS gas is controlled by the MFC 241a, and the HCDS gas is supplied from the nozzle 249a into the process chamber 201 and is exhausted through the exhaust pipe 231. At this time, the HCDS gas is supplied onto the wafers 200. At the same time, the valve 243c is opened to flow an $N_2$ gas into the gas supply pipe 232c. The $N_2$ gas with its flow rate controlled by the MFC 241d is supplied into the process chamber 201 together with the HCDS gas and is exhausted through the exhaust pipe 231.

In addition, in order to prevent infiltration of the HCDS gas into the buffer chamber 237 and the nozzle 249b, the valve 243d is opened to flow the $N_2$ gas into the gas supply pipe 232d. The $N_2$ gas is supplied into the process chamber 201 through the gas supply pipe 232b, the nozzle 249b and the buffer chamber 237 and is exhausted through the exhaust pipe 231.

A supply flow rate of the HCDS gas controlled by the MFC 241a is set to fall within a range of, for example, 1 to 2000 sccm, and in some embodiment, 10 to 1000 sccm. Supply flow rates of the $N_2$ gases respectively controlled by the MFC 241c and 241d are set to fall within a range of, for example, 100 to 10000 sccm. The internal pressure of the process chamber 201 is set to fall within a range of, for example, 1 to 2666 Pa, and in some embodiment, 67 to 1333 Pa. A time duration for which the HCDS gas is supplied onto the wafers 200, i.e., a gas supply time (irradiation time), is set to fall within a range of, for example, 1 to 120 seconds, and in some embodiment, 1 to 60 seconds. The temperature of the heater 207 is set such that a temperature of the wafers 200 may fall within a range, e.g., from 250 to 700 degrees C., in some embodiments, from 300 to 650 degrees C., and in some embodiments, from 350 to 600 degrees C.

If a temperature of the wafer 200 is lower than 250 degrees C., it may be difficult for the HCDS to be chemically adsorbed onto the wafer 200, which may result in a failure of obtaining a practical film formation rate. This can be resolved by setting the temperature of the wafer 200 to 250 degrees C. or more. By setting the temperature of the wafer 200 to 300 degrees C. or more or further 350 degrees C. or more, the HCDS can be more sufficiently adsorbed onto the wafer 200, thereby obtaining a more sufficient film formation rate.

If the temperature of the wafer 200 exceeds 700 degrees C., a CVD reaction is so strengthened (that an excessive gaseous reaction is caused), such that the thickness uniformity is easily deteriorated and it is difficult to control the uniformity. When the temperature of the wafer 200 is set to 700 degrees C. or less, since a proper gaseous reaction can be caused, the deterioration of the thickness uniformity can be prevented and the control of the uniformity can be facilitated. In particular, if the temperature of the wafer 200 is set to 650 degrees C. or less or further 600 degrees C., a surface reaction becomes predominant over a gaseous reaction, whereby the film thickness uniformity can be easily secured and it is easier to control the film thickness uniformity.

Accordingly, the temperature of the wafer 200 may be set to fall within a range of 250 to 700 degrees C., in some embodiments, 300 to 650 degrees C., and in some embodiments, 350 to 600 degrees C.

Under the foregoing conditions, when the HCDS gas is supplied onto the wafer 200 to form a Si-containing layer which contains Cl and has a thickness ranging, e.g., from less than one atomic layer to several atomic layers, on the outermost surface of the wafer 200, i.e., on the SiO film 200a, as a first layer. The Si-containing layer containing Cl may include either or both of a Si layer containing Cl and an adsorption layer of the HCDS gas.

A Cl-containing Si layer collectively refers to layers including a Cl-containing continuous layer formed of Si, a Cl-containing discontinuous layer formed of Si, or a Cl-containing Si thin film formed by overlapping the continuous layer and the discontinuous layer. The Cl-containing continuous layer formed of Si may be referred to as a Cl-containing Si thin film. Si constituting the Cl-containing Si layer includes Si whose bond to Cl is not completely broken and Si whose bond to Cl is completely broken.

The adsorption layer of the HCDS gas includes a continuous adsorption layer of the HCDS molecules and a discontinuous adsorption layer thereof. That is, the adsorption layer of the HCDS gas includes an adsorption layer having a thickness equal to or less than one molecular layer formed of HCDS molecules. The HCDS molecules constituting the adsorption layer of the HCDS gas include molecules in which an Si—Cl bond is partially broken. That is, the adsorption layer of the HCDS gas includes a physisorption layer of the HCDS gas, a chemisorption layer of the HCDS gas, or both thereof.

Here, a layer having a thickness smaller than one atomic layer refers to an atomic layer which is discontinuously formed, and a layer having a thickness equal to one atomic layer refers to an atomic layer which is continuously formed. Also, a layer having a thickness smaller than one molecular layer refers to a molecular layer which is discontinuously formed, and a layer having a thickness equal to one molecular layer refers to a molecular layer which is continuously formed. Further, the Si-containing layer containing Cl may include both the Cl-containing Si layer and the adsorption layer of the HCDS gas. However, as described above, the Si-containing layer containing Cl will be represented by the expression of "one atomic layer," "several atomic layers" or the like.

Under a condition in which the HCDS gas is self-decomposed (pyrolyzed), i.e., under a condition in which a pyrolysis reaction of the HCDS gas occurs, Si is deposited on the wafer 200 to form an Cl-containing Si layer. Under a condition in which the HCDS gas is not self-decomposed (not pyrolyzed), i.e., under a condition in which a pyrolysis reaction of the HCDS gas does not occur, the HCDS gas is adsorbed onto the wafer 200 to form the adsorption layer of the HCDS gas. In some embodiments, forming the Cl-containing Si layer on the wafer 200 is more desirable than forming the adsorption layer of the HCDS gas on the wafer 200, in order to secure a higher film forming rate. Hereinafter, the Cl-containing Si layer is simply referred to as a Si layer for convenience' sake.

If the thickness of the first layer exceeds several atomic layers, an effect of a modification reaction in sub-step 1b described later does not reach the entire first layer. In addition, a minimum value of the thickness of the first layer is less than one atomic layer. Accordingly, the thickness of the first layer ranges from less than one atomic layer to several atomic layers in some embodiments. When the thickness of the first layer is one atomic layer or less, i.e., one atomic layer or less than one atomic layer, an effect of the modification reaction in sub-step 1b described later can be relatively increased, and a time required for the modification reaction in sub-step 1b can be reduced. A time required for forming the first layer in sub-step 1a can also be reduced. As a result, a processing time per one cycle can be reduced, and a total processing time can also be reduced. That is, the film forming rate can be increased. In addition, when the thickness of the first layer is one atomic layer or less, it may become easier to control the film thickness uniformity.

After the first layer is formed, the valve 243a is closed to stop the supply of the HCDS gas. At this time, with the APC valve 244 opened, the interior of the process chamber 201 is evacuated by the vacuum pump 246, and the residual gas remaining in the process chamber 201 such as an unreacted HCDS gas or an HCDS gas, remaining after contributing to the formation of the first layer, is removed out of the process chamber 201. At this time, with the valves 243c and 243d opened, the supply of the $N_2$ gas into the process chamber 201 is maintained. The $N_2$ gas acts as a purge gas, and thus, the residual gas remaining in the process chamber 201 can be effectively removed from the process chamber 201.

At this time, the residual gas remaining in the process chamber 201 may not completely be removed, and the interior of the process chamber 201 may not completely be purged. When the residual gas remaining in the process chamber 201 is very small in amount, there may be no harmful effect on the subsequent sub-step 1b. Here, a flow rate of the $N_2$ gas supplied into the process chamber 201 need not be high. For example, when approximately the same amount of the $N_2$ gas as the volume of the reaction tube 203 (the process chamber 201) is supplied, the purging process can be performed without a harmful effect on the sub-step 1b. In this way, since the interior of the process chamber 201 is not completely purged, the purge time can be reduced and a throughput can be improved. In addition, the consumption of the $N_2$ gas can be restricted to a required minimal amount.

Examples of the first precursor (first precursor gas) may include an inorganic precursor gas such as a dichlorosilane ($SiH_2Cl_2$, abbreviation: DCS) gas, a monochlorosilane ($SiH_3Cl$, abbreviation: MCS) gas, a tetrachlorosilane, i.e., silicon tetrachloride ($SiCl_4$, abbreviation: STC) gas, a trichlorosilane ($SiHCl_3$, abbreviation: TCS) gas, a trisilane ($Si_3H_8$, abbreviation: TS) gas, a disilane ($Si_2H_6$, abbreviation: DS) gas, a monosilane($SiH_4$, abbreviation: MS) gas, or the like, and an organic precursor gas such as a tetrakis (dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tert-butylamino)silane ($SiH_2[NH(C_4H_9)]_2$, abbreviation: BTBAS) gas, or the like, in addition to the HCDS gas.

Examples of an inert gas may include rare gases such as an Ar gas, a He gas, a Ne gas, a Xe gas, and the like, in addition to the $N_2$ gas.

[Sub-Step 1b]

After sub-step 1a is terminated, a thermally-activated $NH_3$ gas is supplied onto the wafer 200 (specifically, the first layer formed on the wafer 200) in the process chamber 201.

Opening/closing of the valves 243b to 243d is controlled in the same manner as the opening/closing of the valves 243a, 243c and 243d in sub-step 1a. With its flow rate controlled by the MFC 241b, the $NH_3$ gas is supplied into the process chamber 201 via the nozzle 249b and the buffer chamber 237 and is exhausted through the exhaust pipe 231. At this time, the $NH_3$ gas is supplied onto the wafer 200.

A supply flow rate of the $NH_3$ gas controlled by the MFC 241b is set to fall within a range of, for example, 100 to 10000 sccm. The internal pressure of the process chamber 201 is set to fall within a range of, for example, 1 to 4000 Pa, and in some embodiments, 1 to 3000 Pa. A partial pressure of the $NH_3$ gas in the process chamber 201 is set to fall within a range of, for example, 0.01 to 3960 Pa. When the internal pressure of the process chamber 201 is set to such a relatively high pressure range, the $NH_3$ gas can be thermally activated with non-plasma. Supplying the thermally-activated $NH_3$ gas can cause a relatively soft reaction, thereby providing soft nitridation described later. A time duration for which the thermally-activated $NH_3$ gas is supplied to the wafer 200, i.e., a gas supply time (irradiation time), may fall within a range of, for example, 1 to 120 seconds, and in some embodiments, 1 to 60 seconds. Other processing conditions are the same as those in sub-step 1a.

At this time, a gas flown into the process chamber 201 is the thermally-activated $NH_3$ gas and no HCDS gas is flown into the process chamber 201. Accordingly, the activated $NH_3$ gas is supplied onto the wafer 200 without causing a gaseous reaction. The $NH_3$ gas supplied onto the wafer 200 reacts with at least a portion of the first layer formed on the wafer 200 in sub-step 1a. Accordingly, the first layer can be thermally nitrided with non-plasma to be changed (modified) into a second layer containing Si and N. The second layer is a layer including an Si—N bond.

In addition, when the second layer is formed, impurities such as Cl and the like contained in the first layer form a gaseous material containing at least Cl during the modification reaction by the $NH_3$ gas and are discharged out of the process chamber 201. That is, the impurities such as Cl and the like in the first layer are separated from the first layer as the impurities are withdrawn or desorbed out of the first layer. Accordingly, the second layer has fewer impurities such as Cl and the like than the first layer.

In addition, by supplying the activated $NH_3$ gas onto the wafer 200, the outermost surface of the first layer is modified during the nitridation of the first layer. The outermost surface of the first layer subjected to the surface modification during the nitridation, i.e., the outermost surface of the second layer, has a condition where the HCDS can be easily adsorbed thereon and Si can be easily deposited thereon in sub-step 1a to be performed in the next cycle. That is, the $NH_3$ gas used in sub-step 1b also acts as an adsorption and deposition promoting gas for promoting adsorption and deposition of the HCDS and Si on the outermost surface of the second layer (the outermost surface of the wafer 200).

At this time, the nitridation reaction of the first layer may not be saturated. For example, when the first layer having a thickness of several atomic layers is formed in sub-step 1a, at least a portion of the surface layer (one atomic layer of the surface) of the first layer may be nitrided. In this case, the nitridation is performed under a condition where the nitridation reaction of the first layer is unsaturated so as to prevent the entire first layer from being nitrided. Depending on the conditions, several layers below the surface layer of the first layer may be nitrided. Also, for example, even when the first layer having a thickness of one atomic layer or less is formed in sub-step 1a, a portion of the surface layer of the first layer may be nitrided in a similar manner. Even in this case, the nitridation is performed under a condition where the nitridation reaction of the first layer is unsaturated so as to prevent the entire first layer from being nitrided.

After the second layer is formed, the valve 243b is closed to stop the supply of the $NH_3$ gas. Then, according to the same procedure as sub-step 1a, the residual gas remaining in the process chamber 201 such as an unreacted $NH_3$ gas or an $NH_3$ gas, remaining after contributing to the formation of the second layer, and reaction byproducts are removed out of the process chamber 201. At this time, like sub-step 1a, the residual gas remaining in the process chamber 201 may not completely be removed.

Examples of the nitriding agent (first nitriding gas) may include hydrogen nitride-based gases such as a diazene ($N_2H_2$) gas, a hydrazine ($N_2H_4$) gas, an $N_3H_8$ gas, and the like, and gases containing compounds thereof, in addition to the $NH_3$ gas. Examples of the inert gas may include the above-mentioned rare gases in addition to the $N_2$ gas.

(Performing Predetermined Number of Times)

When a cycle (first cycle) in which the above-described sub-steps 1a and 1b are alternately performed in a non-simultaneous or asynchronous manner is performed a predetermined number of times (m times), the initial film 210a containing Si and N is formed on the wafer 200, i.e., the SiO film 200a. FIG. 10A shows a state where the initial film 210a is formed on the SiO film 200a. This film 210a forms a lower layer portion of a film to be formed on the wafer 200, i.e., an interfacial portion with the SiO film 200a being a base of film formation.

At this time, the number of times of performance of the first cycle is controlled such that the thickness of the initial film 210 is set to 0.8 nm (8 Å) to 1.5 nm (15 Å), and in some embodiments, 1.0 nm (10 Å) to 1.2 nm (12 Å). The first cycle is repeated multiple times within a range of, for example, eight to fifteen times, and in some embodiments, ten to twelve times. That is, in some embodiments, the first cycle is repeated multiple times until the thickness of the initial film 210a reaches a desired thickness where the thickness of the second layer (layer containing Si and N) formed in performing the first cycle once is smaller than a desired thickness.

This is because there is a case where O contained in the SiO film 200a being the base is introduced into the initial film 210a when the initial film 210a is formed. In this case, the initial film 210a becomes a film containing Si, O and N, i.e., an SiN film containing O (SiON film). However, the initial film 210a containing O is nitrided with plasma in step 2 to be described later (see FIG. 10B) and thus is modified into an SiN film containing no O, i.e., a first SiN film 210b containing more Si—N bonds. Then, when a second SiN film 210c is formed in step 3, which is to be described later (see FIG. 10C), the modified initial film 210a (the first SiN film 210b) acts as a block layer (barrier layer or diffusion preventive layer) for preventing diffusion of O from the SiO film 200a to the second SiN film 210c.

Here, if the thickness of the initial film 210a is less than 8 Å, for example, is 5 Å, a blocking action (diffusion preventive action) by the modified initial film 210a (the first SiN film 210b) is insufficient and thus O is likely to be introduced into the second SiN film 210c. When the thickness of the initial film 210a is 8 Å or more, it becomes possible to sufficiently increase the blocking action against O by the modified film 210a, thereby preventing O from being diffused into the second SiN film 210c. When the thickness of the initial film 210a is 10 Å or more, it becomes possible to further increase the blocking action against O by the modified film 210a, thereby more reliably preventing O from being diffused into the second SiN film 210c.

If the thickness of the initial film 210a exceeds 15 Å, a plasma nitriding action performed in step 2 hardly reaches the whole of the initial film 210a, and therefore, for example, a lower layer portion of the initial film 210a may be insufficiently nitrided. When the thickness of the initial film 210a is 15 Å or less, the plasma nitriding action can easily reach the whole of the initial film 210a, thereby making it possible to sufficiently nitriding the whole of the initial film 210a. When the thickness of the initial film 210a is 12 Å or less, the plasma nitriding action can more reliably reach the whole of the initial film 210a, thereby making it possible to more reliably nitriding the whole of the initial film 210a.

Accordingly, it is desirable that the thickness of the initial film 210a is set to fall within a range of 8 Å to 15 Å, and in some embodiments, 10 Å to 12 Å.

(Step 2: First SiN Film Formation)

In this step, a plasma-activated $NH_3$ gas is supplied onto the wafer 200 in the process chamber 201.

Opening/closing of the valves 243b to 243d is controlled in the same manner as the opening/closing of the valves 243a, 243c and 243d in sub-step 1a. In addition, high frequency power is applied between the bar-shaped electrodes 269 and 270 in order to generate plasma and an $NH_3$ gas supplied into the buffer chamber 237 is activated with this plasma.

A supply flow rate of the $NH_3$ gas controlled by the MFC 241b is set to fall within a range of, for example, 100 to 10000 sccm. The high frequency power applied between the bar-shaped electrodes 269 and 270 is set to fall within a range of, for example, 50 to 1000 W. The internal pressure of the process chamber 201 is set to fall within a range of, for example, 1 to 100 Pa. A partial pressure of the $NH_3$ gas in the process chamber 201 is set to fall within a range of, for example, 0.01 to 100 Pa. When the plasma is used, it is possible to activate the $NH_3$ gas in a relatively low pressure range of internal pressure of the process chamber 201. A time duration for which active species obtained by plasma-exciting the $NH_3$ gas is supplied to the wafer 200, i.e., a gas supply time (irradiation time), may fall within a range of, for example, 1 to 120 seconds, and in some embodiments, 1 to 60 seconds. Other processing conditions are the same as those in sub-step 1a.

Figure 10B:
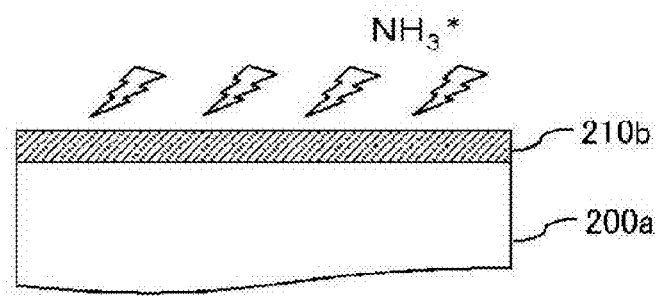
FIG. 10B is a diagram showing a state where the initial film is modified into a first nitride film.

Under the foregoing conditions, when the $NH_3$ gas is supplied onto the wafer 200, the initial film 210a formed on the wafer 200 is plasma-nitrided. At this time, an Si—O bond of the initial film 210a is cut by energy of the plasma-activated $NH_3$ gas and thus O introduced into the initial film 210a is desorbed out of the initial film 210a. Then, Si in the initial film 210a having a dangling bond according to the desorption of O is bonded to N contained in the $NH_3$ gas, thereby forming an Si—N bond. As this reaction is progressing, the initial film 210a is modified into a Si and N-containing and O-non-containing film, i.e., the first SiN film 210b. FIG. 10B shows a state where the first SiN film 210b is formed by plasma-nitriding and modifying the initial film 210a. The initial film 210a is originally a film having an Si—N bond. The first SiN film 210b obtained by plasma-nitriding the initial film 210a is a film which is N-richer than the initial film 210a, i.e., a film containing more S—N bonds and hence having a higher Si—N bond density. In addition, for example, the first SiN film 210b is a film which is N-richer than a film obtained by plasma-nitriding the SiO film 200a, i.e., a film containing more S—N bonds and hence having a higher Si—N bond density.

In addition, when the first SiN film 210b is formed, impurities such as Cl and the like contained in the initial film 210a form a gaseous material containing at least Cl during the modification reaction by the plasma-excited $NH_3$ gas and are discharged out of the process chamber 201. That is, the impurities such as Cl and the like in the initial film 210a are separated from the initial film 210a as the impurities are withdrawn or desorbed out of the initial film 210a. Accordingly, the first SiN film 210b has fewer impurities such as Cl and the like than the initial film 210a.

In addition, in order to modify the initial film 210a into the first SiN film 210b, there is a need to supply a plasma-activated $NH_3$ gas. This is because an $NH_3$ gas thermally-activated under a non-plasma atmosphere lacks in energy required to nitride the initial film 210a in the above-mentioned temperature range (the same temperature range as that described in step 1) and therefore it is difficult to increase the number of Si—N bonds by sufficiently desorbing O out of the initial film 210a or sufficiently nitriding the initial film 210a.

After the plasma nitridation of the initial film 210a is completed to form the first SiN film 210b, the valve 243b is closed to stop the supply of the $NH_3$ gas. In addition, the application of the high frequency power between the bar-shaped electrodes 269 and 270 is stopped. Then, according to the same procedure as sub-step 1a, the residual gas remaining in the process chamber 201 such as an unreacted $NH_3$ gas or an $NH_3$ gas remaining after contributing to the formation of the first SiN film 210b, and reaction byproducts are removed out of the process chamber 201. At this time, like sub-step 1a, the residual gas remaining in the process chamber 201 may not completely be removed.

The same gas as the above-described first nitriding agent (first nitriding gas) or the second nitriding agent (second nitriding gas) to be described later may be used as a gas (plasma-modifying gas) supplied onto the wafer 200 when plasma-nitriding the initial film 210a, in addition to the $NH_3$ gas. In addition to these gases, other gases such as an $N_2$ gas and the like containing N may be widely used as the plasma-modifying gas. Examples of the inert gas may include the above-mentioned rare gases in addition to the $N_2$ gas.

(Step 3: Second SiN Film Formation)

In this step, a cycle (second cycle) in which sub-step 3a of supplying an HCDS gas onto the wafer 200 and sub-step 3b of supplying a thermally-activated $NH_3$ gas onto the wafer 200 are alternately performed in a non-simultaneous or asynchronous manner is performed a predetermined number of times (n times). According to this second cycle, a film containing Si and N, i.e., the second SiN film 210c, is formed on the first SiN film 210b. Sub-steps 3a and 3b have the same procedures and process conditions as sub-steps 1a and 1b. The second SiN film 210c is formed to have a thickness equal to or thicker than a thickness of the first SiN film 210b, and preferably the second SiN film 210c is formed to be thicker than the first SiN film 210b. The number of times (n times) of performance of the second cycle is set to be equal to or, in some embodiments, larger than the number of times (m times) of performance of the first cycle.

By plasma-nitriding the initial film 210a to modify this film into the first SiN film 210b before starting to form the second SiN film 210c, it becomes possible to prevent O from being diffused into the second SiN film 210c. That is, it becomes possible to make the second SiN film 210c an O-non-containing SiN film. In addition, the first SiN film 210b may be maintained (held) in an O-non-containing state. This is because the first SiN film 210b acts as a block layer for preventing O contained in the SiO layer 200a from being diffused. The Si—N bond contained in the first SiN film 210b has the property of more strongly blocking the diffusion of O than an Si—C bond or the like. Accordingly, the first SiN film 210b, which is formed by plasma-nitriding the initial film 210a, i.e., has more Si—N bonds, can more reliably prevent O from being diffused than the initial film 210a before being plasma-nitrided. In addition, the first SiN film 210b can more reliably prevent O from being diffused than a film obtained by plasma-nitriding the SiO film 200a.

Figure 10C:
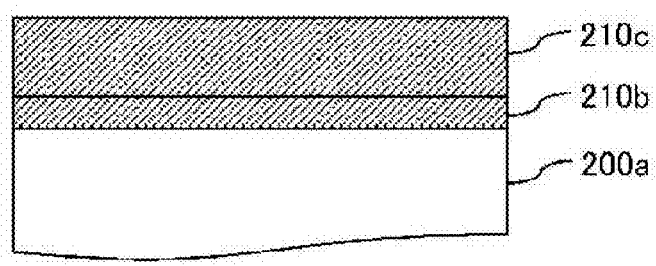
FIG. 10C is a diagram showing a state where a second nitride film is formed on the first nitride film.
Figure 11A:
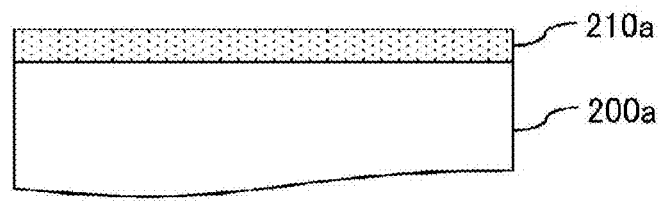
FIG. 11A is a diagram showing a state where an initial film is formed on an oxygen-containing film.
Figure 11B:
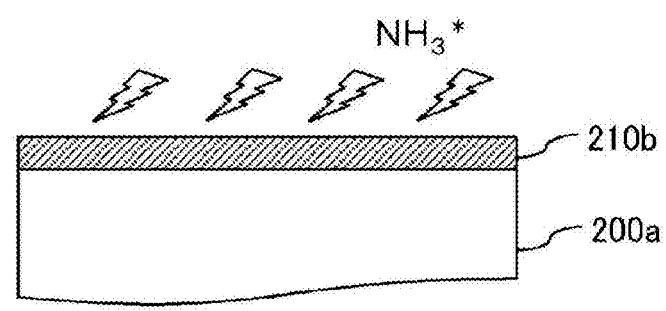
FIG. 11B is a diagram showing a state where the initial film is modified into a first nitride film.
Figure 11C:
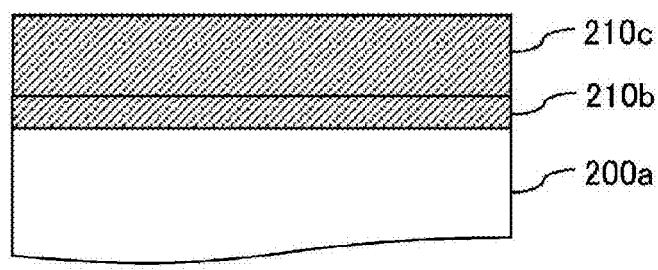
FIG. 11C is a diagram showing a state where a second nitride film is formed on the first nitride film.
Figure 11D:
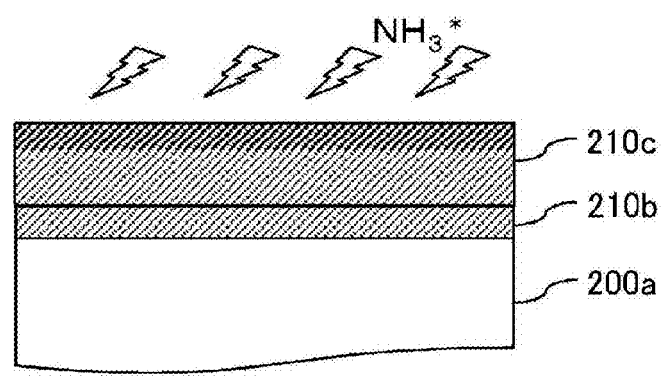
FIG. 11D is a diagram showing a state where the surface of the second nitride film is modified.
Figure 12A:
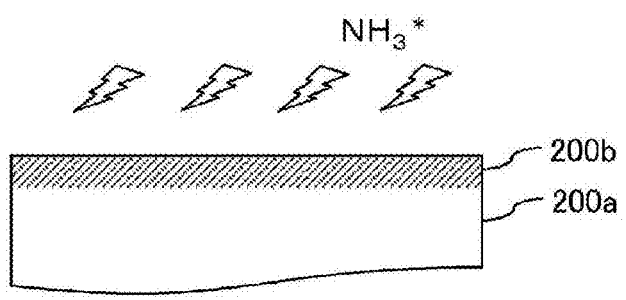
FIG. 12A is a diagram showing a state where a surface of an oxygen-containing film is modified.
Figure 12B:
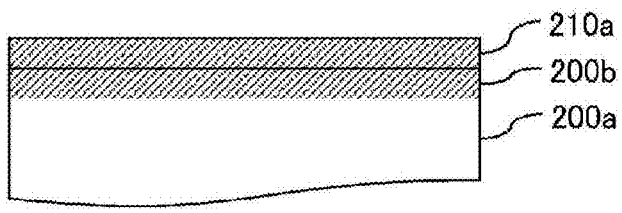
FIG. 12B is a diagram showing a state where an initial film is formed on the oxygen-containing film.
Figure 12C:
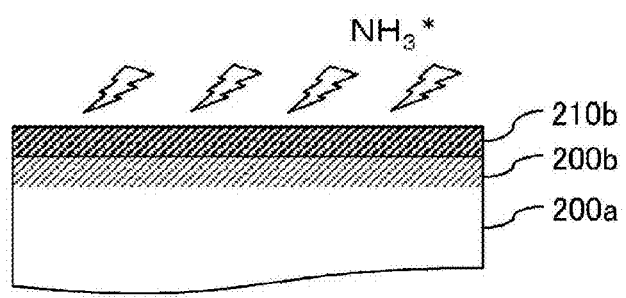
FIG. 12C is a diagram showing a state where the initial film is modified into a first nitride film.
Figure 12D:
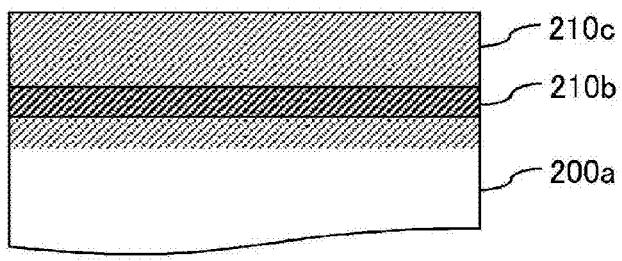
FIG. 12D is a diagram showing a state where a second nitride film is formed on the first nitride film.
Figure 13A:
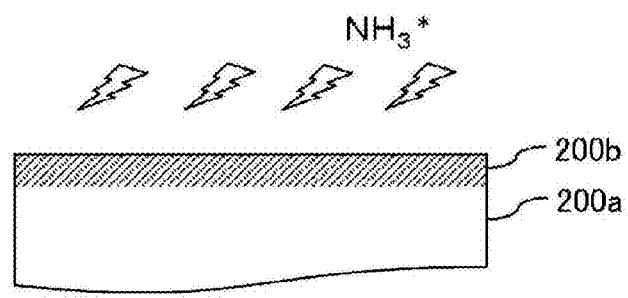
FIG. 13A is a diagram showing a state where a surface of an oxygen-containing film is modified.
Figure 13B:
FIG. 13B is a diagram showing a state where an initial film is formed on the oxygen-containing film.
Figure 13C:
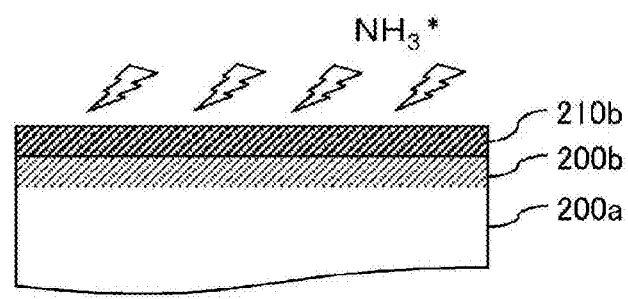
FIG. 13C is a diagram showing a state where the initial film is modified into a first nitride film.
Figure 13D:
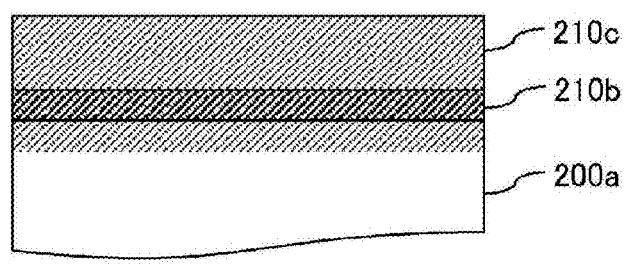
FIG. 13D is a diagram showing a state where a second nitride film is formed on the first nitride film.
Figure 13E:
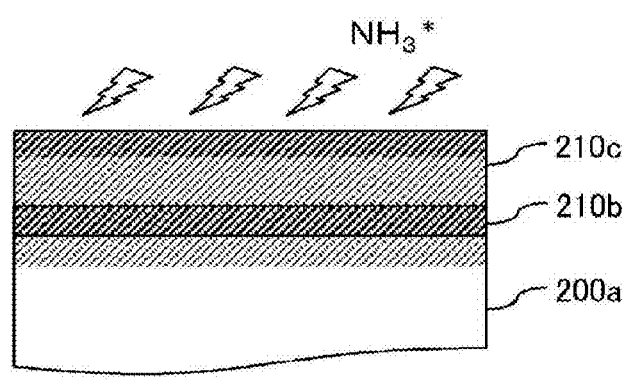
FIG. 13E is a diagram showing a state where the surface of the second nitride film is modified.

By performing step 3, an SiN film (laminated film) composed of a laminate of the first SiN film 210b and the second SiN film 210c is formed on the SiO film 200a. This film (laminated film) is a film having no interface transition layer or an extremely thin interface transition layer, i.e., an O-non-containing SiN film or a film having an extremely small content of O. FIG. 10C shows a state where the laminated film including the first SiN film 210b and the second SiN film 210c is formed on the SiO film 200a.

As the second precursor (second precursor gas), gases having the same molecular structure (chemical structure), i.e., material, as the above-described first precursor may be used in addition to the HCDS gas. As the second nitriding agent (second nitriding gas), gases having the same molecular structure, i.e., material, as the above-described first nitriding agent may be used in addition to the $NH_3$ gas. Examples of the inert gas may include the above-mentioned rare gases in addition to the $N_2$ gas.

(Purging and Returning to Atmospheric Pressure)

After the above-described film forming process is terminated, the valves 243c and 243d are opened to supply an $N_2$ gas from the gas supply pipes 232c and 232d, respectively, into the process chamber 201 and the $N_2$ gas is exhausted through the exhaust pipe 231. The $N_2$ gas acts as a purge gas. Thus, the interior of the process chamber 201 is purged with the purge gas and the residual gas remaining in the process chamber 201 and reaction byproducts are removed from the process chamber 201 (purge). Thereafter, an atmosphere in the process chamber 201 is substituted with the inert gas (inert gas substitution), and the internal pressure of the process chamber 201 returns to the normal pressure (return to the atmospheric pressure).

(Boat Unloading and Wafer Discharging)

The seal cap 219 is descended by the boat elevator 115 to open the lower end of the reaction tube 203. The processed wafers 200 are unloaded to the outside of the reaction tube 203 through the lower end of the reaction tube 203, being supported by the boat 217 (boat unloading). Then, the processed wafers 200 are discharged from the boat 217 (wafer discharging).

(3) Effects of the Embodiment

According to this embodiment, one or more effects are provided as described below.

(a) By plasma-nitriding the initial film 210a in step 2, O diffused from the SiO film 200a and introduced into the initial film 210a can be desorbed out of the initial film 210a. As a result, the initial film 210a can be modified into the first SiN film 210b containing no O.

(b) By plasma-nitriding the initial film 210a containing the Si—N bond in order to modify the initial film 210a into the first SiN film 210b, the first SiN film 210b can contain more Si—N bonds than a film modified by plasma-nitriding the SiO film 200a. A film containing more Si—N bonds acts to more reliably prevent O from being diffused. As a result, in step 3, O can be prevented from being again diffused into the first SiN film 210b. In addition, by preventing O from being diffused into the second SiN film 210c, it is possible to make this film 210c an O-non-containing film.

(c) Thus, an O-non-containing SiN film (a laminated film including the first SiN film 210b and the second SiN film 210c) having no interface transition layer can be formed on the wafer 200 having the surface on which the SiO film 200a is formed. Then, even when the thickness of this film (laminated film) is set to about 30 Å, it is possible to make this film a high quality film having high resistance to HF.

(d) By performing the film forming process under a non-plasma atmosphere in steps 1 and 3 and using plasma only in the modification process in step 2, it is possible to minimize a plasma damage to the wafer 200 and members in the process chamber 201. That is, according to this embodiment, it is possible to further reduce a damage undergone by the wafer 200 and so on as compared to a case where all of steps 1 to 3 are performed under a plasma atmosphere.

(e) In steps 1 and 3, by supplying the HCDS gas and the NH$_3$ gas in a non-simultaneous manner, these gases can appropriately contribute to a reaction under a condition where an appropriate gaseous reaction or surface reaction occurs. As a result, it is possible to improve the step coverage and film thickness controllability of a film formed on the wafer 200. In addition, it is possible to avoid an excessive gaseous reaction in the process chamber 201 and prevent occurrence of particles.

(f) The above-described effects can be equally achieved even when gases other than the HCDS gas are used as the first and second precursors and even when gases other than the NH$_3$ gas are used as the first and second nitriding agents or the plasma-modifying gas.

In addition, the above-described effects are not limited to the case where gases having the same molecular structure (chemical structure) (i.e., the same material) are used as the first and second precursors, but may be equally achieved even when gases having different molecular structures (different materials) are used as the first and second precursors. For example, the above-described effects can be equally achieved even when an HCDS gas is used as the first precursor and an MCS gas is used as the second precursor.

In addition, the above-described effects are not limited to the case where gases having the same molecular structure (chemical structure) (i.e., the same material) are used as the first and second nitriding agents, but may be equally achieved even when gases having different molecular structures (different materials) are used as the first and second nitriding agents. For example, the above-described effects can be equally achieved even when an NH$_3$ gas is used as the first nitriding agent and an N$_2$H$_4$ gas is used as the second nitriding agent.

(4) Modifications

The film forming sequence in this embodiment is not limited to the forms shown in FIGS. 4 and 10A to 10C but may be altered as the following modifications.

(Modification 1)

After the nitride film forming process is completed, if the substrate is exposed to the air, O in the air may be introduced into an upper layer portion of the nitride film, i.e., near the surface of the nitride film. FIG. 9A is a diagram showing a state where O is introduced into the upper layer of the nitride film when the substrate on which an SiN film is formed is exposed to the air under the normal temperature. The nitride layer containing O is a layer having a different composition from a film (O-non-containing nitride film) to be formed on the substrate, like the above-described interface transition layer, which may be a factor of lowering the resistance of the film formed on the substrate against hydrogen fluoride (HF). Therefore, the nitride layer having a surface containing O may be also referred to as a deterioration layer (surface deterioration layer) or a transition layer (surface transition layer). In some cases, the surface transition layer may be formed even under the normal temperature after completion of the film forming process.

A range of O introduction, in other words, the thickness of the surface transition layer, is about 30 Å. Therefore, if the thickness of a nitride film formed on an O-containing film is set to about 30 Å, most of the formed film may be occupied in the surface transition layer or the entire film may become a nitride film containing O. FIG. 9B is a diagram showing a state where most of the nitride film is occupied in the surface transition layer. In this way, a nitride film having a high percentage of occupation in the surface transition layer may be significantly decreased in resistance to HF as compared to an O-non-containing nitride film.

To overcome this problem, in this modification, as shown in FIGS. 5 and 11A to 11D, after forming the second SiN film 210c on the first SiN film 210b, a step of plasma-nitriding the surface of the second SiN film 210c in order to modify the surface is performed. The procedures and process conditions from the formation of the initial film 210a to the formation of the second SiN film 210c may be the same as those of steps 1 to 3 in the film forming sequence shown in FIG. 4. The procedures and process conditions of the step of modifying the surface of the second SiN film 210c may be the same as those of step 2 in the film forming sequence shown in FIG. 4. In addition, the film forming sequence of this modification may be represented as below.

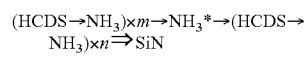

Figure 4:
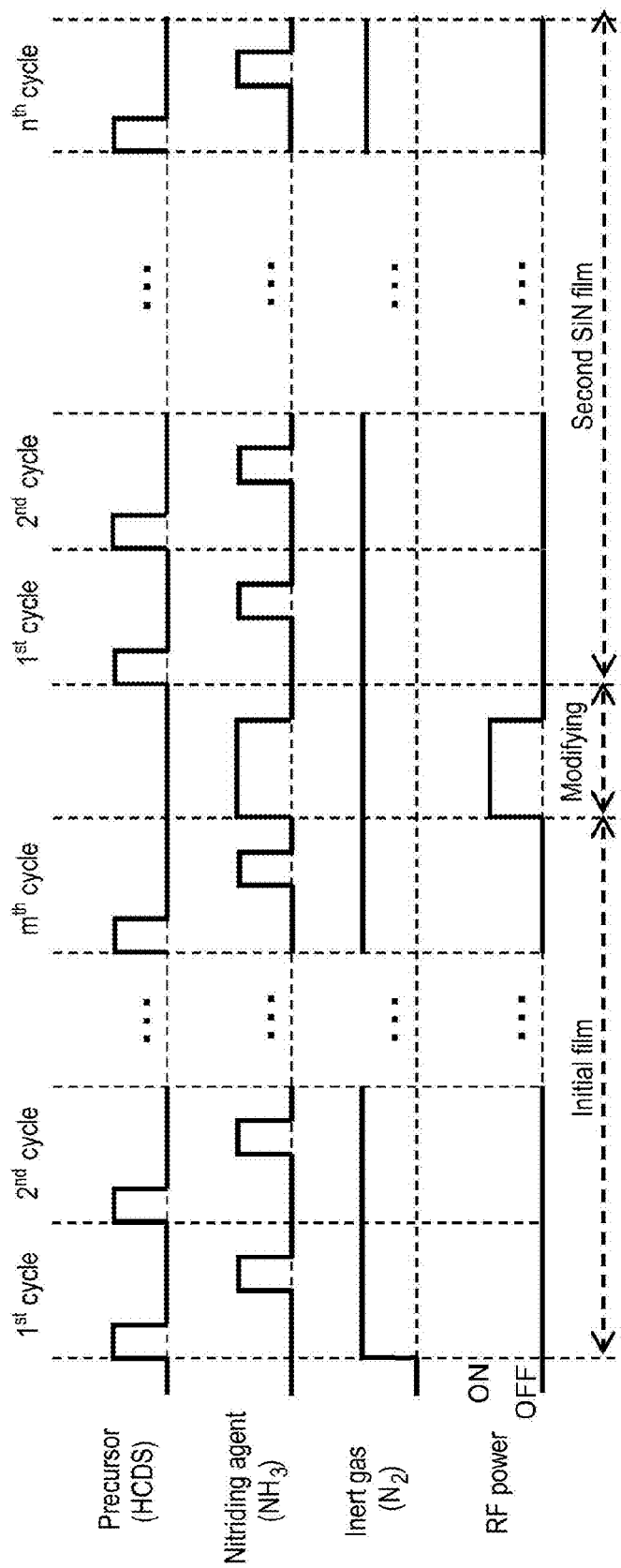
FIG. 4 is a diagram illustrating gas supply and plasma power supply timings in a film forming sequence according to one embodiment of the present disclosure.
Figure 5:
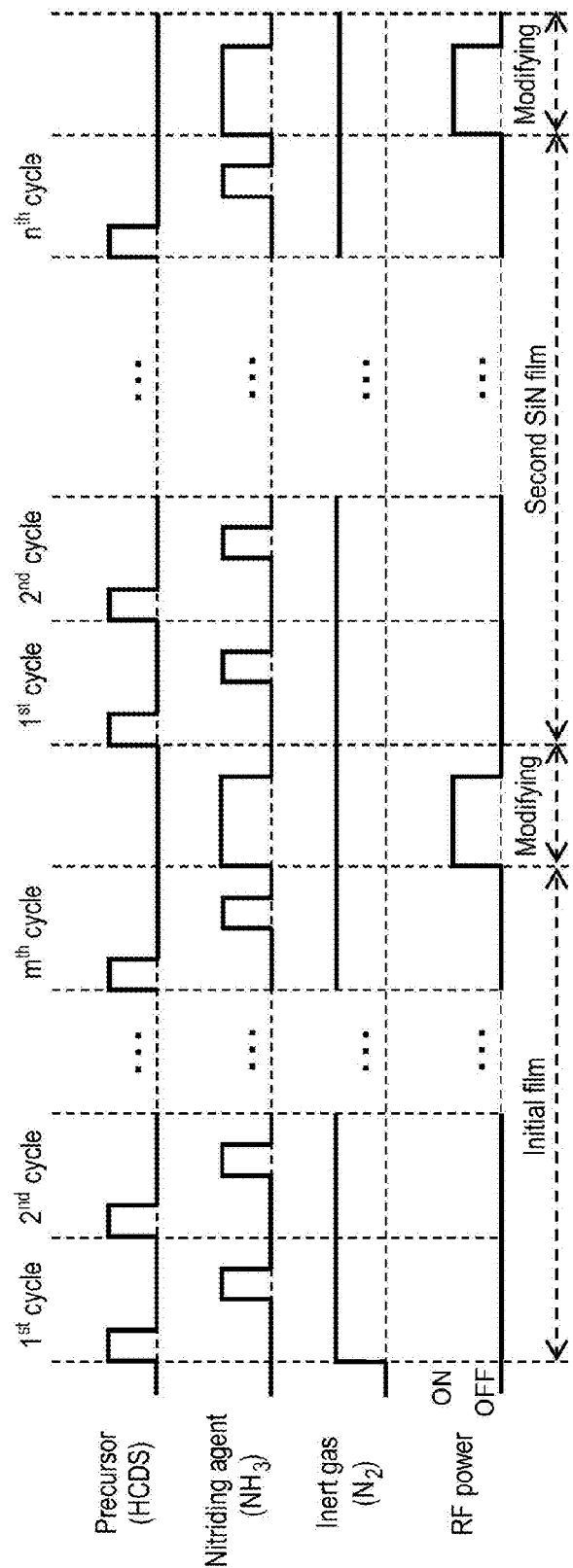
FIG. 5 is a diagram illustrating gas supply and plasma power supply timings in Modification 1 of the film forming sequence according to one embodiment of the present disclosure.
Figure 6:
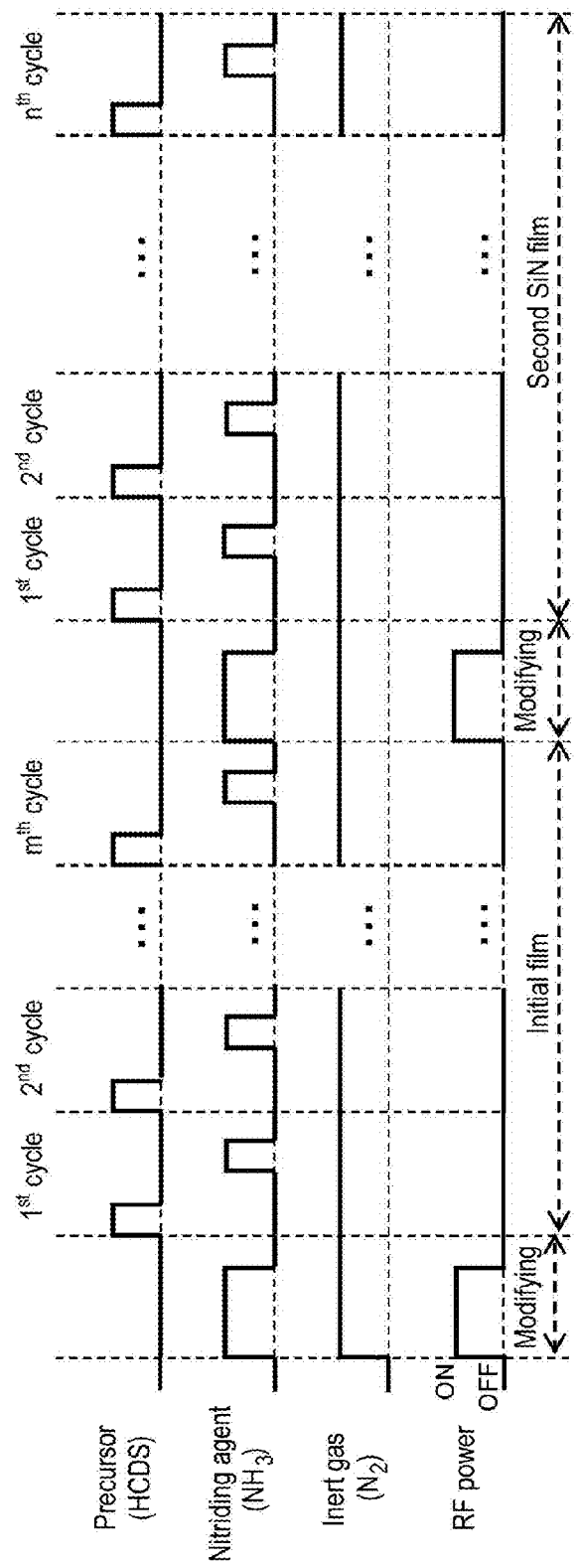
FIG. 6 is a diagram illustrating gas supply and plasma power supply timings in Modification 2 of the film forming sequence according to one embodiment of the present disclosure.

This modification can achieve the same effects as the film forming sequence shown in FIG. 4. In addition, by plasma-nitriding and modifying the surface of the second SiN film 210c after the completion of film formation, this surface can be a surface which is N-richer, i.e., has more Si—N bonds, than a surface before being modified. As a result, it is possible to prevent a surface transition layer from being formed when the wafer 200 is exposed to the air after completion of the film forming process.

(Modification 2)

As shown in FIGS. 6 and 12A to 12D, prior to step 1 of forming the initial film 210a, a step of plasma-nitriding the surface of the SiO film 200a in order to modify the surface into a nitride layer (SiN layer or SiON layer) may be performed. The procedures and process conditions of the step of modifying the surface of the SiO film 200a may be the same as those of step 2 in the film forming sequence shown in FIG. 4. The procedures and process conditions from the formation of the initial film 210a to the formation of the second SiN film may be the same as those of steps 1 to 3 in the film forming sequence shown in FIG. 4. In addition, the film forming sequence of this modification may be represented as below.

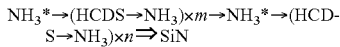

This modification can also achieve the same effects as the film forming sequence shown in FIG. 4. In addition, by plasma-nitriding and modifying the surface of the SiO film 200a before performing step 1, the SiN layer or SiON layer (layer containing an Si—N bond) formed on this surface can act as a block layer for preventing O from being diffused. As a result, it is possible to prevent O from being diffused into the initial film 210a in step 1, thereby more reliably preventing a surface transition layer from being formed.

(Modification 3)

As shown in FIGS. 7 and 13A to 13D, the above-described modifications 1 and 2 may be used in combination. Specifically, a step of plasma-nitriding the surface of the SiO film 200a in order to modify the surface into an SiN layer or SiON layer prior to step 1 of forming the initial film 210a, and a step of plasma-nitriding the surface of the second SiN film 210c in order to modify the surface after forming the second SiN film 210c may be performed. The procedures and process conditions of this modification may be the same as those of the film forming sequence shown in FIG. 4 and those of modifications 1 and 2. In addition, the film forming sequence of this modification may be represented as below.

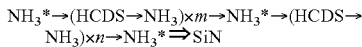

This modification can also achieve the same effects as the film forming sequence shown in FIG. 4 and modifications 1 and 2. In addition, according to this modification, it is possible to more reliably prevent an interface transition layer and a surface transition layer from being formed.

(Modification 4)

One set including steps 1 and 2 may be repeated a predetermined number of times (twice or more) to form the first SiN film 210b and, thereafter, step 3 may be performed to form the second SiN film 210c. The procedures and process conditions of the steps in this modification may be the same as those of steps 1 to 3 in the film forming sequence shown in FIG. 4. This modification can also achieve the same effects as the film forming sequence shown in FIG. 4. In addition, it is possible to increase the thickness of the first SiN film 210b having a high Si—N bond density. As a result, it is possible to further enhance a blocking action against O by the first SiN film 210b and more reliably prevent an interface transition layer from being formed.

(Modifications 5 to 11)

According to the following film forming sequences (in order of modifications 5 to 11), a silicon carbonitride film (SiCN film), a silicon oxycarbonitride film (SiOCN film), a silicon oxynitride film (SiON film), a silicon borocarbonitride film (SiBCN film), a silicon boronitride film (SiBN film), a boron carbonitride film (BCN film) and a boron nitride film (BN film) may be formed on the wafer 200, specifically, the SiO film 200a.

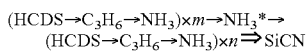

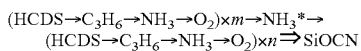

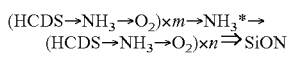

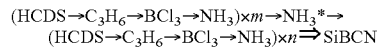

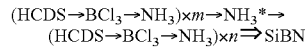

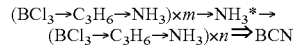

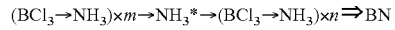

These modifications can also achieve the same effects as the above-described embodiment. Specifically, when the film forming sequences of the above-mentioned modifications 5 to 11, it is possible to prevent an O-containing SiCN layer, an O-rich SiOCN layer, an O-rich SiON layer, an O-containing SiBCN layer, an O-containing SiBN layer, an O-containing BCN layer and an O-containing BN layer from being formed respectively as interface transition layers.

In addition, in a step of supplying a $C_3H_6$ gas onto the wafer 200, a supply flow rate of $C_3H_6$ gas controlled by the MFC 241b is set to fall within a range of, for example, 100 to 10000 sccm. The internal pressure of the process chamber 201 is set to fall within a range of, for example, 1 to 5000 Pa, and in some embodiment, 1 to 4000 Pa. In addition, a partial pressure of the $C_3H_6$ gas in the process chamber 201 is set to fall within a range of, for example, 0.01 to 4950 Pa. A time duration for which the $C_3H_6$ gas is supplied onto the wafer 200, i.e., a gas supply time (irradiation time), is set to fall within a range of, for example, 1 to 200 seconds, in some embodiments, 1 to 120 seconds, and in some embodiment, 1 to 60 seconds. Other processing conditions are the same as those of sub-step 1b in the film forming sequence shown in FIG. 4. Examples of C-containing gases may include hydrocarbon-based gases such as an acetylene ($C_2H_2$) gas and an ethylene ($C_2H_4$) gas, in addition to the $C_3H_6$ gas.

In a step of supplying an $O_2$ gas onto the wafer 200, a supply flow rate of $O_2$ gas controlled by the MFC 241b is set to fall within a range of, for example, 100 to 10000 sccm. The internal pressure of the process chamber 201 is set to fall within a range of, for example, 1 to 4000 Pa, and in some embodiment, 1 to 3000 Pa. In addition, a partial pressure of the $O_2$ gas in the process chamber 201 is set to fall within a range of, for example, 0.01 to 3950 Pa. A time duration for which the $O_2$ gas is supplied onto the wafer 200, i.e., a gas supply time (irradiation time), is set to fall within a range of, for example, 1 to 120 seconds, and in some embodiment, 1 to 60 seconds. Other processing conditions are the same as those of sub-step 1b in the film forming sequence shown in FIG. 4. Examples of O-containing gases may include vapor ($H_2O$ gas), nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a mixture of hydrogen ($H_2$) gas and $O_2$ gas, a mixture of $H_2$ gas and $O_3$ gas, and the like, in addition to the $O_2$ gas.

In a step of supplying a $BCl_3$ gas onto the wafer 200, a supply flow rate of $BCl_3$ gas controlled by the MFC 241b is set to fall within a range of, for example, 100 to 10000 sccm. The internal pressure of the process chamber 201 is set to fall within a range of, for example, 1 to 2666 Pa, and in some embodiment, 67 to 1333 Pa. A partial pressure of the $BCl_3$ gas in the process chamber 201 is set to fall within a range of, for example, 0.01 to 2640 Pa. A time duration for which the $BCl_3$ gas is supplied onto the wafer 200, i.e., a gas supply time (irradiation time), is set to fall within a range of, for example, 1 to 120 seconds, and in some embodiment, 1 to 60 seconds. Other processing conditions are the same as those of sub-step 1b in the film forming sequence shown in FIG. 4. Examples of B-containing gases may include a monochloroborane (BClH$_2$) gas, a dichloroborane (BCl$_2$H) gas, a trifluoroborane (BF$_3$) gas, a tribromoborane (BBr$_3$) gas, a diborane (B$_2$H$_6$) gas and the like, in addition to the BCl$_3$ gas.

Other Embodiments of the Present Disclosure

The embodiments of the present disclosure have been described in detail. However, the present disclosure is not limited to the foregoing embodiments and its modifications may be variously modified without departing from the spirit of the present disclosure.

For example, it has been illustrated in the above embodiment that steps 1 to 3 are successively performed in the same process chamber, i.e., in-situ. However, the present disclosure is not limited thereto. For example, step 1 of forming the initial film and step 2 of modifying the initial film into the first SiN film may be performed either in the same process chamber in-situ or different process chambers ex-situ.

However, it is desirable that step 2 of modifying the initial film into the first SiN film and step 3 of forming the second SiN film on the first SiN film are performed in-situ, not ex-situ. This is because, if these steps are performed ex-situ, O may be introduced onto the surface of the first SiN film when the wafer is transferred in the air, and an O-containing layer may be sandwiched in a formed SiN film (laminated film including the first SiN film and the second SiN film).

In addition, when a step of plasma-nitriding the surface of the wafer (base) is performed prior to step 1 of forming the initial film as in the above-described modifications 2 and 3, it is desirable to perform this step in-situ, not ex-situ. This is because, if this step is performed ex-situ, O may be introduced onto the surface of the modified wafer (base) when the wafer is transferred in the air, and an O-containing layer may be formed near a lower layer of a formed SiN film (laminated film including the first SiN film and the second SiN film).

In addition, for example, it has been illustrated in the above embodiment that the same SiN films are formed as the first nitride film and the second nitride film, i.e., the same kind of nitride films of the same kind are formed in steps 1 and 2 and step 3. However, the present disclosure is not limited thereto. For example, an SiN film may be formed in steps 1 and 2 and one of an SiCN film, an SiBN film, an SiBCN film and an SiON film may be formed in step 3. That is, different kinds of nitride films may be formed in steps 1 and 2 and step 3. However, it is desirable to form nitride films of the same kind in steps 1 and 2 and step 3.

In addition, for example, it has been illustrated in steps 1 and 3 in the above embodiment that a cycle of supplying a precursor gas and a reaction gas (nitriding agent) in this order is performed a predetermined number of times. However, the present disclosure is not limited thereto. For example, the supply order of precursor gas and reaction gas may be reversed. That is, the precursor gas may be supplied after the reaction gas is supplied. Such reversal of the supply order makes it possible to change film quality and composition ratio of a film to be formed. In addition, when different kinds of reaction gases are used as in modifications 5 to 11, the supply order of these reaction gases may be changed at random. Such reversal of the supply order makes it possible to change film quality and composition ratio of a film to be formed.

When a silicon-based insulating film formed according to the film forming sequence shown in FIG. 4 or one of the methods of the above modifications is used as a sidewall spacer, it is possible to provide a device forming technique with a small leak current and excellent workability. In addition, when this silicon-based insulating film is used as an etch stopper, it is possible to provide a device forming technique with excellent workability. In addition, according to the film forming sequence shown in FIG. 4, since plasma is used only in some step, it is possible to adopt this technique for a process concerned about a plasma damage, such as forming a SADP film of DPT.

The above-described film forming sequence may be properly performed even when forming a metal-based nitride film containing a metal element such as titanium (Ti), zirconium (Zr), hafnium (Hf), tantalum (Ta), niobium (Nb), molybdenum (Mo), tungsten (W) or the like on the substrate. For example, a titanium tetrachloride (TiCl$_4$) gas, zirconium tetrachloride (ZrCl$_4$) gas, hafnium tetrachloride (HfCl$_4$) gas, tantalum pentachloride (TaCl$_5$) gas, niobium pentachloride (NbCl$_5$) gas, molybdenum pentachloride (MoCl$_5$) gas and tungsten hexafluoride (WF$_6$) gas may be used as precursor gases to form a TiN film, ZrN film, HfN film, TaN film, NbN film, MoN film and WN film, respectively, on a substrate having a surface on which an O-containing film is formed, according to the following film forming sequences.

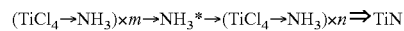

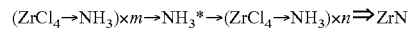

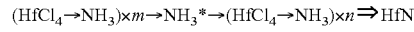

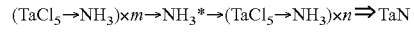

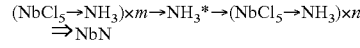

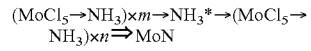

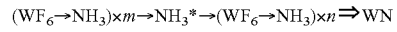

The procedures and process conditions of these film forming sequences may be the same as those of the above embodiment and modifications. These film forming sequences can also achieve the same effects as the above embodiment and modifications.

That is, the present disclosure can be appropriately applied to a case of forming a nitride film containing a semiconductor element or a metal element.

A process recipe for use in forming these various kinds of thin films (program in which procedures or process conditions of the film forming process are described) may be individually prepared (a plurality of things are prepared) based on contents of the film forming process (the kind of film to be formed, a composition ratio, a film quality, a film thickness, procedures, process conditions, and the like). Hereinafter, the process recipe is also simply referred to as a recipe. In addition, when substrate processing is initiated, a suitable recipe may be selected among the plurality of recipes based on contents of the substrate processing. Specifically, the plurality of recipes individually prepared depending on contents of the substrate processing may be previously stored (installed) in the memory device 121*c* provided in the substrate processing apparatus via an electrical communication line or a recording medium (e.g., the external memory device 123) in which the recipes are recorded. In addition, when the substrate processing is initiated, the CPU 121*a* provided in the substrate processing apparatus may appropriately select a suitable recipe among the plurality of recipes stored in the memory device 121c based on contents of the substrate processing. With this configuration, thin films having a variety of film types, composition ratios, film qualities and film thicknesses can be formed with high versatility and high reproducibility in one substrate processing apparatus. In addition, since an operator's work load (a load of inputting procedures or process conditions, or the like) can be lessened, it is possible to rapidly initiate the substrate processing while avoiding an operational error.

The above-described process recipe is not limited to a newly prepared recipe and may be prepared, for example, by modifying an existing recipe that is already installed in the substrate processing apparatus. When the recipe is modified, the modified recipe may be installed on the substrate processing apparatus via an electrical communication line or a recording medium in which the recipe is recorded. In addition, the recipe previously installed in the substrate processing apparatus may be directly changed by manipulating the input/output device 122 of the substrate processing apparatus.

In the above-described embodiment, an example of using a batch type substrate processing apparatus in which a plurality of substrates is processed at a time for forming a thin film has been illustrated. The present disclosure is not limited thereto but may be appropriately applied to a case in which a single-wafer type substrate processing apparatus which processes one or several substrates at a time is used to form a thin film. In addition, in the above-described embodiment, an example of using a substrate processing apparatus having a hot wall type processing furnace in forming a thin film has been illustrated. The present disclosure is not limited thereto but may be appropriately applied to a case in which a substrate processing apparatus having a cold wall type processing furnace is used to form a thin film. Even in these cases, procedures and process conditions may be the same as those in the above-described embodiment.

Figure 15A:
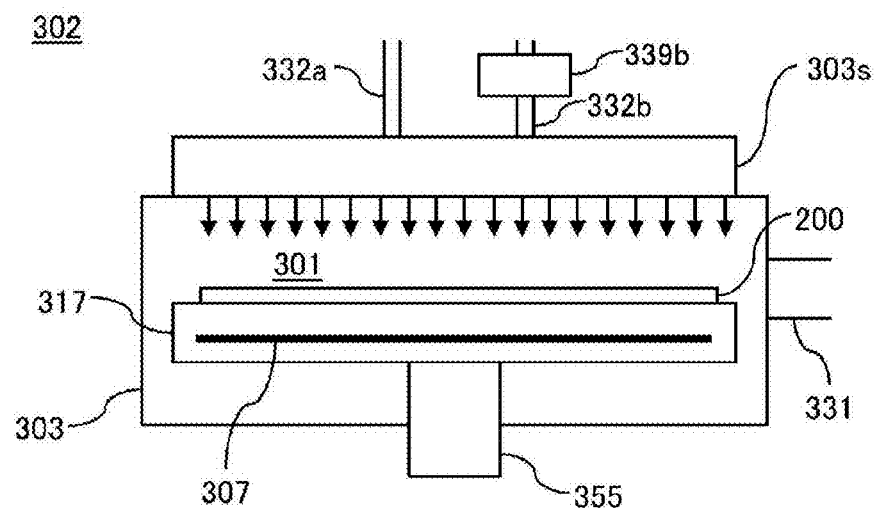
FIG. 15A is a schematic view illustrating a configuration of a processing furnace of a substrate processing apparatus suitably used in another embodiment of the present disclosure, the processing furnace being shown in a longitudinal sectional view.

For example, the present disclosure may be appropriately applied to a case in which a substrate processing apparatus having a processing furnace 302 shown in FIG. 15A is used to form a film. The processing furnace 302 includes a process vessel 303 forming a process chamber 301, a shower head 303s as a gas supply part which supplies a gas in the form of a shower into the process chamber 301, a support base 317 which supports one or several wafers 200 in a horizontal position, a rotary shaft 355 which supports the support base 317 from a bottom end of the support base 317, and a heater 307 installed in the support base 317. An inlet (gas introduction port) of the shower head 303s is connected with a gas supply port 332a for supplying the above-described precursor gas and a gas supply port 332b for supplying the above-described reaction gas. The gas supply port 332a is connected with a gas supply system which is similar to the precursor gas supply system in the above-described embodiment. The gas supply port 332b is connected with a remote plasma part (plasma generator) 339b as an exciting part for plasma-exciting the above-described reaction gas and a gas supply system which is similar to the reaction gas supply system in the above-described embodiment. A gas distribution plate for supplying a gas in the form of a shower into the process chamber 301 is installed in an outlet (gas discharging port) of the shower head 303s. The shower head 303s is installed at a position opposing (facing) the surfaces of the wafers 200 loaded into the process chamber 301. An exhaust port 331 for exhausting the interior of the process chamber 301 is installed in the process vessel 303. The exhaust port 331 is connected with an exhaust system which is similar to the exhaust system in the above-described embodiment.

Figure 15B:
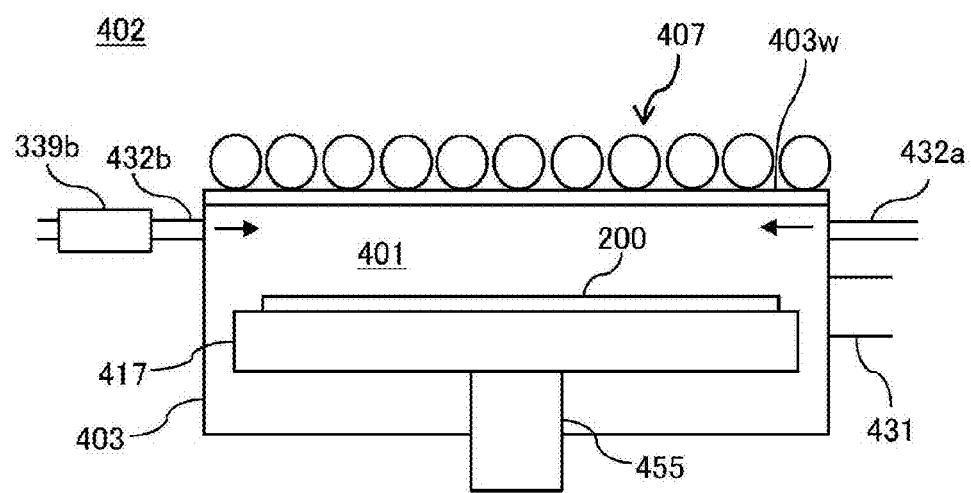
FIG. 15B is a schematic view illustrating a configuration of a processing furnace of a substrate processing apparatus suitably used in still another embodiment of the present disclosure, the processing furnace being shown in a longitudinal sectional view.

In addition, for example, the present disclosure may be appropriately applied to a case in which a substrate processing apparatus having a processing furnace 402 shown in FIG. 15B is used to form a film. The processing furnace 402 includes a process vessel 403 forming a process chamber 401, a support base 417 which supports one or several wafers 200 in a horizontal position, a rotary shaft 455 which supports the support base 417 from a bottom end of the support base 417, a lamp heater 407 which performs light irradiation on the wafers 200 in the process vessel 403, and a quartz window 403w which transmits the light from the lamp heater 407. The process vessel 403 is connected with a gas supply port 432a for supplying the above-described precursor gas and a gas supply port 432b as a gas supply part for supplying the above-described reaction gas. The gas supply port 432a is connected with a gas supply system which is similar to the precursor gas supply system in the above-described embodiment. The gas supply port 432b is connected with the above-described remote plasma part 339b and a gas supply system which is similar to the reaction gas supply system in the above-described embodiment. The gas supply ports 432a and 432b are installed in the lateral side of end portions of the wafers 200 loaded into the process chamber 401, i.e., at a position which does not oppose (face) the surfaces of the wafers 200 loaded into the process chamber 401. An exhaust port 431 for exhausting the interior of the process chamber 401 is installed in the process vessel 403. The exhaust port 431 is connected with an exhaust system which is similar to the exhaust system in the above-described embodiment.

Even when these substrate processing apparatuses are used, a film forming process can be performed with the same sequences and process conditions as the above-described embodiment and modifications and the same effects as the above-described embodiment and modifications can be achieved.

In addition, the above-described embodiment and modifications may be used in proper combination. Process conditions at that time may be the same as those in the above-described embodiment.

EXAMPLES

Results of experiments substantiating the effects achieved by the above-described embodiment and modifications will be described below.

The substrate processing apparatus shown in FIG. 1 was used to prepare Sample 1 by performing a process of forming an SiN film on a wafer having a surface on which an SiO film was formed, according to the film forming sequence shown in FIG. 4. In steps 1 and 3 of forming the initial film and the second SiN film, an HCDS gas and an $NH_3$ gas were used as a precursor gas and a nitriding gas, respectively. In step 2 of forming the first SiN film by modifying the initial film, a plasma-excited $NH_3$ gas was used as a plasma modifying gas. The process conditions in each of the steps were set to fall within the range of the process conditions described in the above embodiment.

In addition, the substrate processing apparatus shown in FIG. 1 was used to prepare Sample 2 by performing a process of forming an SiN film on a wafer having a surface on which an SiO film was formed, according to the film forming sequence shown in FIG. 4. In steps 1 and 3, an HCDS gas and an $NH_3$ gas were used as a precursor gas and a nitriding gas, respectively. In step 2, a plasma-excited N$_2$ gas was used as a plasma modifying gas. The process conditions in each of the steps were the same as those for Sample 1.

In addition, the substrate processing apparatus shown in FIG. 1 was used to prepare Sample 3 by performing a process of forming an SiN film on a wafer having a surface on which an SiO film was formed, according to the same procedures as steps 1 and 3 in the film forming sequence shown in FIG. 4. An HCDS gas and an NH$_3$ gas were used as a precursor gas and a nitriding gas, respectively. No modification of the initial film was performed. Process conditions were the same as those in steps 1 and 3 for Sample 1.

Figure 14:
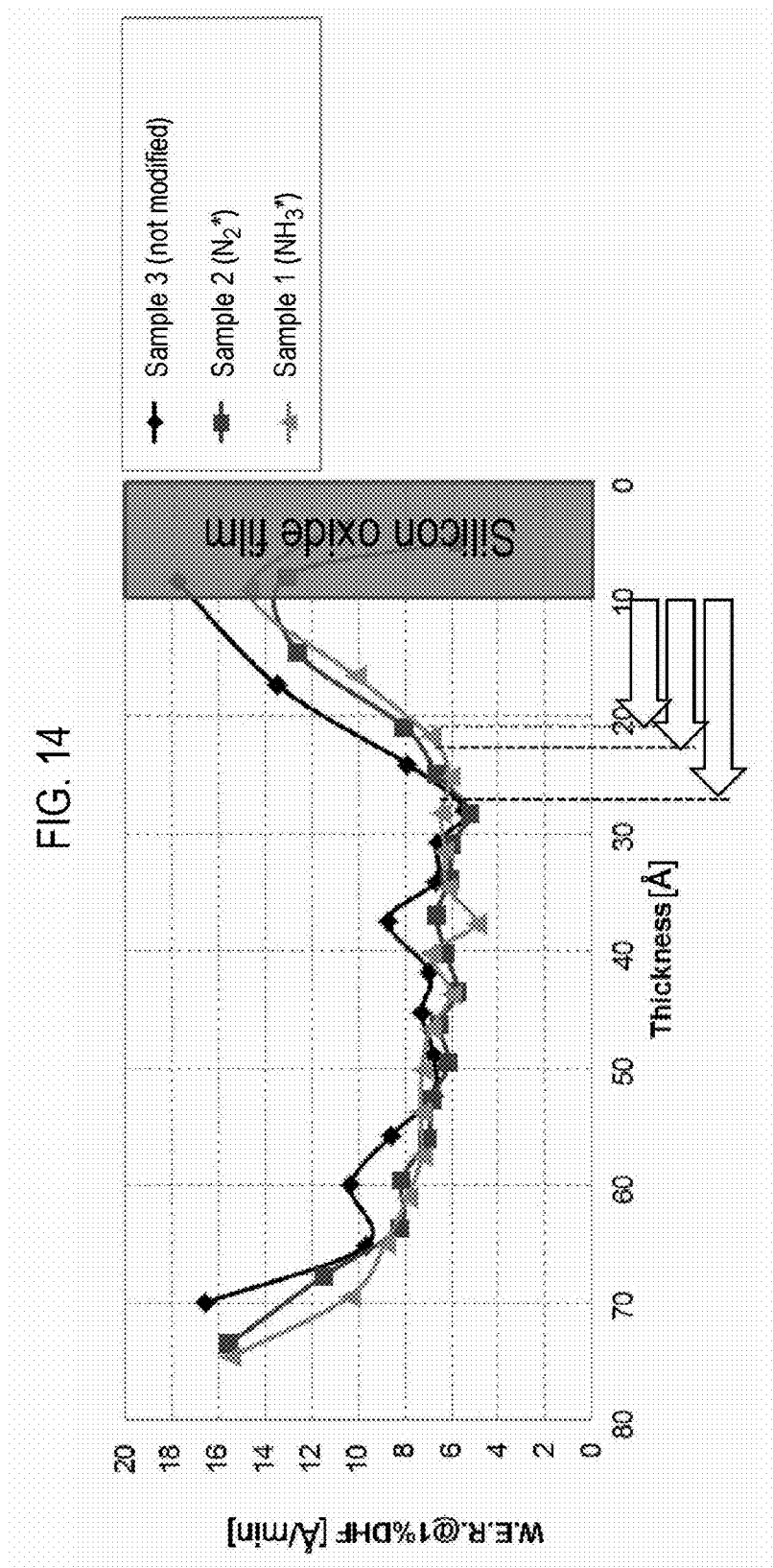
FIG. 14 is a diagram showing a result of the evaluation on etching resistance of a nitride film formed on an oxygen-containing film.

Then, etching resistance (resistance to workability) was measured for each SiN film of each sample. FIG. 14 is a diagram showing a wet etching rate (a depth profile of WER) obtained when an HF aqueous solution of 1% of concentration was used to etch the SiN in each sample. In FIG. 14, a vertical axis represents an SiN film etching rate (A/min) and a horizontal axis represents the total thickness (A) of an SiO film and an SiN film. An interface between the SiO film and the SiN film is present at a position of 10 Å in the horizontal axis. In the figure, ▲, ■ and ♦ denote Sample 1, Sample 2 and Sample 3, respectively.

It can be seen from FIG. 14 that the etching rate of the SiN films formed in Samples 1 and 2 is smaller than the etching rate of the SiN film formed in Sample 3 within a range of 10 to 25 Å (range of 15 Å or less from the interface) in the horizontal axis. It is considered that this is because the SiN films of Samples 1 and 2 have lower O concentration near the interface than the SiN film of Sample 3. That is, it is considered that, in Samples 1 and 2, the plasma-nitrided initial film (the first SiN film) blocks diffusion of O, thereby preventing O from being diffused into the SiN film (i.e., preventing an interface transition layer from being formed). It can also be seen that the etching rate of the SiN film formed in Sample 1 tends to be smaller than the etching rate of the SiN film formed in Sample 2. That is, it can be seen that the modification effect of the initial film can be further enhanced by using the plasma-excited NH3 gas having a relatively strong nitriding power to modify the initial film, which results in further prevention of O from being diffused into the SiN film.

Aspects of the Present Disclosure

Hereinafter, some aspects of the present disclosure will be additionally stated.
(Supplementary Note 1)
According to an aspect of the present disclosure, there is provided a method of manufacturing a semiconductor device or a method of processing a substrate, including: supplying a first precursor and a first nitriding agent onto a substrate having a surface formed thereon with an oxygen-containing film in order to form an initial film on the oxygen-containing film; modifying the initial film into a first nitride film by nitriding the initial film with plasma; and supplying a second precursor and a second nitriding agent onto the substrate in order to form a second nitride film on the first nitride film.
(Supplementary Note 2)
In the method according to Supplementary Note 1, the initial film is a nitride film containing oxygen (oxynitride film). That is, in forming the initial film, as oxygen contained in the oxygen-containing film being a base is introduced into the initial film, the initial film becomes a nitride film containing oxygen (oxynitride film). The initial film is referred to as a deterioration layer or a transition layer.
(Supplementary Note 3)
In the method according to Supplementary Note 1 or 2, the second nitride film is formed to have a thickness equal to or thicker than a thickness of the first nitride film.
(Supplementary Note 4)
In the method according to any one of Supplementary Notes 1 to 3, the second nitride film is formed to be thicker than the first nitride film.
(Supplementary Note 5)
In the method according to any one of Supplementary Notes 1 to 4, the act of forming the initial film includes performing a first cycle a first predetermined number of times, the first cycle including: supplying the first precursor onto the substrate; and supplying the first nitriding agent onto the substrate, the act of supplying the first precursor onto the substrate and the act of supplying the first nitriding agent onto the substrate being performed in a non-simultaneous (alternating) manner.
(Supplementary Note 6)
In the method according to Supplementary Note 5, the act of forming the second nitride film includes performing a second cycle a second predetermined number of times, the second cycle including: supplying the second precursor onto the substrate; and supplying the second nitriding agent onto the substrate, the act of supplying the second precursor onto the substrate and the act of supplying the second nitriding agent onto the substrate being performed in a non-simultaneous (alternating) manner.
(Supplementary Note 7)
In the method according to Supplementary Note 6, the second predetermined number of times is set to be larger than the first predetermined number of times. That is, the number of times of performance of the second cycle is set to be larger than the number of times of performance of the first cycle.
(Supplementary Note 8)
In the method according to any one of Supplementary Notes 1 to 7, a thickness of the initial film is set to fall within a range of 0.8 nm (8 Å) to 1.5 nm (15 Å).
(Supplementary Note 9)
In the method according to any one of Supplementary Notes 1 to 8, a thickness of the initial film is set to fall within a range of 1.0 nm (10 Å) to 1.2 nm (12 Å).
(Supplementary Note 10)
In the method according to any one of Supplementary Notes 1 to 9, the method further includes: nitriding the surface of the second nitride film with plasma (thereby to modify the surface of the second nitride film).
(Supplementary Note 11)
In the method according to any one of Supplementary Notes 1 to 10, the method further includes: nitriding the surface of the oxygen-containing film with plasma prior to forming the initial film (thereby to modify the surface of the oxygen-containing film into a nitride layer).
(Supplementary Note 12)
In the method according to any one of Supplementary Notes 1 to 11, the first nitriding agent or the second nitriding agent excited with plasma is supplied onto the substrate when the plasma nitridation is performed.
(Supplementary Note 13)
In the method according to any one of Supplementary Notes 1 to 12, the first precursor has the same molecular structure (chemical structure) as the second precursor. That is, the first precursor is the same as the second precursor in material.

(Supplementary Note 14)

In the method according to any one of Supplementary Notes 1 to 13, the first nitriding agent has the same molecular structure (chemical structure) as the second nitriding agent. That is, the first nitriding agent is the same as the second nitriding agent in material.

(Supplementary Note 15)

According to another aspect of the present disclosure, there is provided a substrate processing apparatus including: a process chamber configured to accommodate a substrate; a precursor supply system configured to supply a first precursor and a second precursor onto the substrate in the process chamber; a nitriding agent supply system configured to supply a first nitriding agent and a second nitriding agent onto the substrate in the process chamber; a plasma exciting part configured to excite the first nitriding agent or the second nitriding agent with plasma; and a control part configured to control the precursor supply system, the nitriding agent supply system and the plasma exciting part to a process including: under a state where the substrate having a surface formed thereon with an oxygen-containing film is accommodated in the process chamber, supplying the first precursor and the first nitriding agent onto the substrate in order to form an initial film on the oxygen-containing film; modifying the initial film into a first nitride film by nitriding the initial film with plasma by supplying the first nitriding agent or the second nitriding agent excited with plasma onto the substrate; and supplying the second precursor and the second nitriding agent onto the substrate in order to form a second nitride film on the first nitride film.

(Supplementary Note 16)

According to still another aspect of the present disclosure, there is provided a non-transitory computer-readable recording medium storing a program that causes a computer to perform a process of: supplying a first precursor and a first nitriding agent onto a substrate having a surface formed thereon with an oxygen-containing film in order to form an initial film on the oxygen-containing film; modifying the initial film into a first nitride film by nitriding the initial film with plasma; and supplying a second precursor and a second nitriding agent onto the substrate in order to form a second nitride film on the first nitride film.

According to the present disclosure in some embodiments, it is possible to improve the composition controllability, film quality and so on of a nitride film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

supplying a first precursor and a first nitriding agent onto a substrate having a surface formed thereon with an oxygen-containing film in order to form an initial film containing oxygen on the oxygen-containing film;

modifying the initial film into a first nitride film not containing oxygen by nitriding the initial film with plasma; and supplying a second precursor and a second nitriding agent onto the substrate in order to form a second nitride film not containing oxygen on the first nitride film.

2. The method of claim 1, wherein the initial film is a nitride film containing oxygen.

3. The method of claim 1, wherein the second nitride film is formed to have a thickness equal to or thicker than a thickness of the first nitride film.

4. The method of claim 1, wherein the second nitride film is formed to be thicker than the first nitride film.

5. The method of claim 1, wherein the act of forming the initial film includes performing a first cycle a first predetermined number of times, the first cycle including: supplying the first precursor onto the substrate; and supplying the first nitriding agent onto the substrate, the act of supplying the first precursor onto the substrate and the act of supplying the first nitriding agent onto the substrate being performed in a non-simultaneous manner.

6. The method of claim 5, wherein the act of forming the second nitride film includes performing a second cycle a second predetermined number of times, the second cycle including: supplying the second precursor onto the substrate; and supplying the second nitriding agent onto the substrate, the act of supplying the second precursor onto the substrate and the act of supplying the second nitriding agent onto the substrate being performed in a non-simultaneous manner.

7. The method of claim 6, wherein the second predetermined number of times is set to be larger than the first predetermined number of times.

8. The method of claim 1, wherein a thickness of the initial film is set to fall within a range of 0.8 nm to 1.5 nm.

9. The method of claim 1, wherein a thickness of the initial film is set to fall within a range of 1.0 nm to 1.2 nm.

10. The method of claim 1, further comprising: nitriding the surface of the second nitride film with plasma.

11. The method of claim 1, further comprising: nitriding the surface of the oxygen-containing film with plasma prior to forming the initial film.

12. The method of claim 1, wherein the first nitriding agent or the second nitriding agent excited with plasma is supplied onto the substrate when the plasma nitridation is performed.

13. The method of claim 1, wherein the first precursor has the same molecular structure as the second precursor.

14. The method of claim 1, wherein the first nitriding agent has the same molecular structure as the second nitriding agent.

15. The method of claim 1, wherein the act of modifying the initial film into the first nitride film and the act of forming the second nitride film on the first nitride film are performed in a same process chamber.

16. The method of claim 11, wherein the act of nitriding the surface of the oxygen-containing film with plasma and the act of forming the initial film are performed in a same process chamber.

17. The method of claim 1, wherein in the act of modifying the initial film, oxygen contained in the initial film is desorbed out of the initial film.

18. The method of claim 1, wherein a Si—N bond density of the first nitride film is higher than a Si—N bond density of the initial film.

* * * * *